(12) United States Patent
Loh et al.

(10) Patent No.: US 11,422,721 B2
(45) Date of Patent: Aug. 23, 2022

(54) DATA STORAGE SCHEME SWITCHING IN A DISTRIBUTED DATA STORAGE SYSTEM

(71) Applicant: Dropbox, Inc., San Francisco, CA (US)

(72) Inventors: Michael Loh, El Cerrito, CA (US); Daniel R. Horn, Mountain View, CA (US); Andraz Kavalar, San Francisco, CA (US); David Lichtenberg, San Francisco, CA (US); Austin Sung, San Francisco, CA (US); Shi Feng, Millbrae, CA (US); Jongmin Baek, Foster City, CA (US)

(73) Assignee: DROPBOX, INC., San Francisco, CA (US)

( * ) Notice: Subject to any disclaimer, the term of this patent is extended or adjusted under 35 U.S.C. 154(b) by 201 days.

(21) Appl. No.: 16/839,605

(22) Filed: Apr. 3, 2020

(65) Prior Publication Data

US 2021/0240372 A1 Aug. 5, 2021

Related U.S. Application Data

(60) Provisional application No. 62/968,885, filed on Jan. 31, 2020.

(51) Int. Cl.
*G06F 3/06* (2006.01)
*G06N 20/00* (2019.01)
*G06N 7/00* (2006.01)
*H03M 13/15* (2006.01)

(52) U.S. Cl.
CPC ............ *G06F 3/0634* (2013.01); *G06F 3/067* (2013.01); *G06F 3/0611* (2013.01); *G06F 3/0653* (2013.01); *G06N 7/005* (2013.01); *G06N 20/00* (2019.01); *H03M 13/154* (2013.01)

(58) Field of Classification Search
None
See application file for complete search history.

(56) References Cited

U.S. PATENT DOCUMENTS

| | | | |
|---|---|---|---|
| 6,912,317 B1 | 6/2005 | Barnes et al. | |
| 7,865,503 B2 | 1/2011 | Piedmonte | |
| 8,239,641 B2 | 8/2012 | Apacible et al. | |
| 8,832,709 B2 | 9/2014 | Noam et al. | |
| 9,052,826 B2 | 6/2015 | Quan et al. | |
| 9,235,590 B1 | 1/2016 | Wang et al. | |
| 9,514,149 B2 | 12/2016 | Ackerman et al. | |
| 10,169,121 B2 | 1/2019 | Vibhor et al. | |
| 11,137,926 B1 * | 10/2021 | Pendharkar | G06F 3/067 |

(Continued)

*Primary Examiner* — Stephanie Wu
(74) *Attorney, Agent, or Firm* — Fenwick & West LLP

(57) ABSTRACT

Systems and methods for dynamic and automatic data storage scheme switching in a distributed data storage system. A machine learning-based policy for computing probable future content item access patterns based on historical content item access patterns is employed to dynamically and automatically switch the storage of content items (e.g., files, digital data, photos, text, audio, video, streaming content, cloud documents, etc.) between different data storage schemes. The different data storage schemes may have different data storage cost and different data access cost characteristics. For example, the different data storage schemes may encompass different types of data storage devices, different data compression schemes, and/or different data redundancy schemes.

20 Claims, 17 Drawing Sheets

(56) References Cited

U.S. PATENT DOCUMENTS

| | | | |
|---|---|---|---|
| 11,210,133 B1* | 12/2021 | Barker, Jr. | G06F 9/4862 |
| 2013/0097380 A1* | 4/2013 | Colgrove | G06F 3/0641 |
| | | | 711/118 |
| 2018/0024752 A1* | 1/2018 | Miller | G06F 3/0689 |
| | | | 711/154 |
| 2018/0232395 A1* | 8/2018 | Deshmukh | G06F 3/0617 |
| 2018/0276134 A1* | 9/2018 | Cherubini | G06F 12/0888 |
| 2019/0079689 A1 | 3/2019 | Cherubini et al. | |
| 2019/0265890 A1* | 8/2019 | Barajas Gonzalez | G06N 20/00 |
| 2020/0306632 A1* | 10/2020 | Kolen | A63F 13/30 |
| 2021/0034242 A1* | 2/2021 | Dalmatov | G06F 3/0611 |

\* cited by examiner

DATA STORAGE SCHEME SWITCHING IN A DISTRIBUTED DATA STORAGE SYSTEM

PRIORITY CLAIM

This application claims the benefit of U.S. provisional patent application No. 62/968,885, filed Jan. 31, 2020, the entire contents of which is hereby incorporated by reference as if fully set forth herein.

TECHNICAL FIELD

This disclosure relates generally to data storage, including but not limited to systems and methods for dynamic and automatic data storage scheme switching, such as switching between different data storage schemes having different data storage cost and data access cost characteristics.

BACKGROUND

Large-scale distributed data storage systems process massive amounts of data. The variability in cost-performance of different types of data storage devices have spurred the development of storage tiering in such systems. However, providers of such systems are burdened with managing the different storage tiers having different data storage cost and data access cost profiles. This management includes the complexity of optimizing the placement of data within the different storage tiers for different data access workloads while balancing data storage cost and data access cost.

Systems and methods disclosed herein address this and other issues.

The approaches described in this section are approaches that could be pursued, but not necessarily approaches that have been previously conceived or pursued. Therefore, unless otherwise indicated, it should not be assumed that any of the approaches described in this section qualify as prior art, or are well-understood, routine, or conventional, merely by virtue of their inclusion in this section.

DETAILED DESCRIPTION

Figure 1:
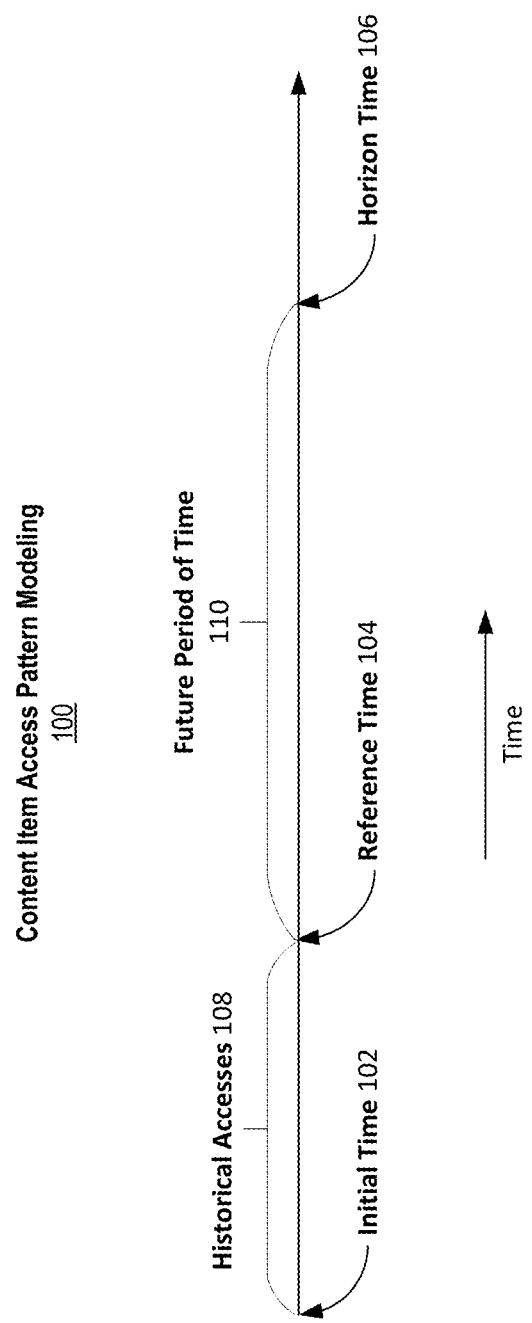
FIG. 1 depicts content item access pattern modeling of a content item, according to some embodiments.

In the following description, for the purposes of explanation, numerous specific details are set forth in order to provide a thorough understanding of various systems and methods for data storage scheme switching. It will be apparent, however, that these systems and methods may be practiced without these specific details. In other instances, structures and devices are shown in block diagram form in order to avoid unnecessarily obscure aspects of the systems and methods.

Overview

According to some embodiments, systems and methods are disclosed for dynamic and automatic data storage scheme switching. A machine learning-based policy for computing probable future content item access patterns based on historical content item access patterns is employed to dynamically and automatically switch the storage of content items (e.g., files, digital data, photos, text, audio, video, streaming content, cloud documents, etc.) between different data storage schemes. The different data storage schemes may have different data storage cost and different data access cost characteristics. For example, the different data storage schemes may encompass different types of data storage devices, different data compression schemes, and/or different data redundancy schemes.

Machine Learning

Before continuing the overview, some machine learning terminology is discussed for purposes of illustration, not limitation, in order to assist with understanding this disclosure.

As used herein, the term "machine learning" encompasses one or more computing devices (computers) being "trained" using statistical methods to produce a mathematical model based on data analysis. Machine learning training produces a mathematical model that is derived by the one or more computing devices and is expressed in a form that may not be completely comprehensible to human experts (lacks a degree of interpretability).

As used herein, the terms "machine learning model," "content item access pattern model," "learned model," or just "model" encompasses a mathematical model produced by a machine learning training process (e.g., supervised, semi-supervised, and/or unsupervised learning process). The process of producing a model by a machine learning training process is sometimes referred to herein as "learning." The process of using a learned model and applying it to new or unseen data (e.g., a new content item) to "infer" (compute) something (e.g., a probability of future access of a content item) about the new or unseen data is sometimes referred to herein as "inference."

Appropriately dealing with time when learning and using a model to compute future content item access patterns based on historical content item access patterns is a technical challenge. For example, datetime timestamps commonly found in log data may not be suitable machine learning features for learning or inference because of their monotonically increasing nature. According to some embodiments, systems and methods are disclosed herein for learning and using a model capable of computing probabilities of future accesses of content items based on historical access of the content items while accounting for the complexities of time in both learning and inference.

Example Data Storage Cost Measurements

Before continuing the overview, some examples of measuring a data storage cost of storing a content item according to a data storage scheme are offered for purposes of illustration, not limitation, in order to assist with understanding this disclosure.

A data storage cost of storing a content item according to a data storage scheme can be measured in various different ways. For example, the data storage cost may be measured based on the number of units of data (e.g., the number of bytes) that are needed to store the content item, with more units of data needed to store the content item meaning a higher data storage cost on this basis and fewer units of data needed to store the content item meaning a lower data storage cost on this basis. For example, a compressed content item may have a lower data storage cost on this basis than the uncompressed content item because the compressed content item represents the information of the content item in fewer bytes than the uncompressed content item. As another example, creating three copies of the content item for data redundancy purposes (3-times replication) may have a higher data storage cost on this basis than erasure-coding the content item because an erasure-coding of the content item can provide sufficient data redundancy for the information of the content item in fewer bytes than can 3-times replication.

As another example, the data storage cost can be measured based on the monetary cost needed to store a unit of information (e.g., a byte), with higher monetary cost meaning a higher data storage cost on this basis and lower monetary cost meaning a lower data storage cost on this basis. For example, solid-state drives may have a higher data storage cost on this basis than hard disk drives because of the per-unit cost price differences. As another example, storing data in one geographic location may have a higher data storage cost than storing the same data in another geographic location.

An overall data storage cost of storing a content item according to a data storage scheme can be a combination of individual data storage costs. For example, the overall data storage cost could be a combination (e.g., weighted) of (a) the number of units of data (e.g., the number of bytes) that are needed to store the content item according to the scheme, and (b) the monetary cost needed to store a unit of information (e.g., a byte) according to the data storage scheme.

The foregoing provides just some examples of possible measurements that may be incorporated into a data storage cost model of a data storage scheme and no particular set of measurements or particular data storage cost model is required. Techniques disclosed herein may be used to reduce data storage costs through the timely and automatic switching of content items between data storage schemes.

Example Data Access Cost Measurements

Before continuing the overview, some examples of measuring a data access cost of accessing a content item stored according to a data storage scheme are offered for purposes of illustration, not limitation, in order to assist with understanding this disclosure.

A data access cost of accessing a content item stored according to a data storage scheme can be measured in various different ways. For example, the data access cost may be measured based on the amount of time (e.g., average or mean latency, etc.) that is needed to access (e.g., create, read, update, or delete) the content item or a portion thereof, with a longer amount of time meaning a higher data access cost on this basis and a shorter amount of time meaning a lower data access cost on this basis. For example, accessing the content item or portion thereof stored on a hard disk drive can have a higher data access cost than accessing the content item or portion stored on a solid-state drive because of the movement of physical components in the hard disk drive that may be needed to access the content item that are not needed to access the content item in the solid-state drive.

As another example, the data access cost may be measured based on the amount of network bandwidth consumed accessing the content item or a portion thereof, with a greater amount of network bandwidth consumed meaning a higher data access cost on this basis and less amount of network bandwidth consumed meaning a lower data access cost on this basis. For example, because of the nature of reconstructing the original data from erasure-coded data, recovering a content item from an erasure-coding of the content item stored on multiple inter-networked computing nodes can consume more network bandwidth than accessing a single copy of the content item that has been 3-times replicated.

As another example, the data access cost may be measured based on the number of CPU cycles consumed (e.g., average or mean number of CPU cycles consumed, etc.) accessing the content item or a portion thereof, with a greater number of CPU cycles needed meaning a higher data access cost on this basis and a fewer number of CPU cycles needed meaning a lower data access cost on this basis. For example, because of the nature of erasure-coding, recovering a content item from an erasure-coded version of the content item can consume more CPU cycles than accessing a single copy of a 3-times replicated content item.

As another example, the data access cost can be measured based on the monetary cost needed to transmit a unit of information (e.g., a byte) over one or more data communication networks, with higher monetary cost meaning a higher data access cost on this basis and lower monetary cost meaning a lower data access cost on this basis. For example, a network provider may charge an operator of a large-scale centrally hosted file system or other large-scale network service a monetary amount for each unit of data sent and/or received by the service that is transmitted on a data communications network operated by the network provider. For example, the data communications network may connect two or more geographically distributed data center computing facilities used by the large-scale service. The monetary amount charge by the network provider may vary depending on the time of day, the day of the week, or time of year. For example, the monetary amount charged may vary from a baseline amount depending on whether the data is transmitted over the network during on-peak hours (e.g., during the middle of the business day), during off-peak hours (e.g., during the middle of the night), on weekends, on holidays, etc.

Like an overall data storage cost, an overall data access cost of accessing a content item stored according to a data storage scheme can be a combination of individual data access costs. For example, an overall data access cost might be a combination (e.g., weighted) of at least two of: (a) an access latency of a content item stored according the data storage scheme, (b) the monetary cost of the network bandwidth consumed to access the content item stored according to the scheme, and (c) the number of CPU cycles consumed accessing a content item or a portion thereof stored according to the scheme.

The foregoing provides just some examples of possible measurements that may be incorporated into a data access cost model of a data storage scheme and no particular set of measurements or particular data access cost model is required. Techniques disclosed herein may be implemented to reduce data access costs for content items by timely and automatic switching of the content items between different data storage schemes.

Hotter and Colder Storage

Before continuing the overview, some data storage scheme terminology is discussed for purposes of illustration, not limitation, in order to assist with understanding this disclosure.

To facilitate the discussion, a data storage scheme having a higher data storage cost and a lower data access cost relative to another data storage scheme is sometimes referred to herein as a "hotter" storage relative to the other data storage scheme. The other data storage scheme is sometimes referred to as a "colder" storage relative to the hotter storage.

It will be appreciated by those skilled in the art that what is a colder storage with respect to one data storage scheme may be a hotter storage with respect to another data storage scheme. For example, a first data storage scheme that employs volatile memory devices (e.g., dynamic random-access memory devices (DRAM) or static random-access memory devices (SRAM)) may be a hotter storage with respect to a second data storage scheme that employs solid-state drives which in turn may be a hotter storage with respect to a third data storage scheme that employs hard disk drives. In this case, the second data storage scheme is a colder storage with respect to the first data storage scheme and the third data storage scheme is a colder storage with respect to both the second and the first data storage schemes. The first data storage scheme is a hotter storage than both the second and third storage schemes.

Overview (Continued)

With the above description of machine learning, example data storage costs, example data access cost, and hotter and colder data storage schemes in mind, the description will now return to discussion of the overview.

According to some embodiments, systems and methods disclosed herein employ machine learning to compute probable content item access patterns and use the computed probabilities to dynamically and automatically switch the storage of content items from a hotter storage to a colder storage and/or from a colder storage to a hotter storage, thereby improving the operation of a distributed data storage system (sometimes referred to hereinafter as "the system") through better utilization of the limited data storage, computing, network, and electrical power resources of the system. At the same time, content items are stored according to a data storage scheme appropriate for the probable access pattern for the content items. For example, a content item currently stored in colder storage but that is likely to be accessed in the near future may be automatically switched to a hotter storage having a lower data access cost for the content item in anticipation of the access. As another example, a content item currently stored in a hotter storage but that is unlikely to be accessed for some time may be automatically switched to colder storage having a lower data storage cost for the content item.

Example Technical Problem Solved

As mentioned, large-scale distributed data storage systems such as, for example, large-scale centrally hosted network file systems or other large-scale network services, store and process massive amounts of data. Such systems perform substantial input/output. While newer data storage technologies such as non-volatile random-access memories (e.g., ferroelectric random-access memory (FRAM), magneto-resistive random-access memory (MRAM)) and solid-state drives (SSDs) can be utilized to increase input/output (I/O) performance, it can be cost-prohibitive to store the large amounts (e.g., petabytes, exabytes, or possibly more) of data hosted by such systems all in data storage devices utilizing the latest data storage technologies. Thus, providers of such systems may wish to use more cost effective, but less I/O performant, data storage technologies (e.g., hard disk drives, tape devices, etc.) for storing at least some of the data. Furthermore, different data compression, and/or data redundancy schemes may be used. The result is that these systems, for various reasons, may employ various different data storage schemes for storing data.

With different data storage scheme options comes increased complexity. A basic data storage scheme switching policy may be inefficient. For example, with a basic storage scheme switching policy, content items may initially be stored in a hotter storage and then switched to colder storage after a predetermined amount of time since an initial storage time or after a predetermined amount of time since a last access time. For example, with a basic data storage scheme switching policy, a content item may initially be stored in a hotter storage than switched to colder storage if the content item in a hotter storage has not been accessed within the past thirty (30) days. The predetermined amount of time may be a selected heuristic, for example. However, some content items may be accessed soon after the content items are initially stored in a hotter storage and not accessed again until well after they are switched to a colder storage. Meanwhile, those content items are unnecessarily consuming space in a hotter storage before they are switched to colder storage. Consequently, a hotter storage may be provisioned with more data storage resources (e.g., more solid-state drives, and/or hard disks) than is needed.

More generally, the lack of automated switching of content items between data storage schemes places a substantial burden on administrators of large-scale distributed data storage systems, who may be responsible with optimizing various types of data access workloads. For example, some content items may be accessed relatively soon (e.g., within minutes, hours, or days) after they are initially stored in the system. Other content items may not be accessed for a long time (e.g., weeks, months, or years) after they are initially stored in the system. Switching content items from a hotter storage to colder storage when the content items won't be accessed for an extended period of time and switching them back to a hotter storage just before they are accessed may be a better use of limited data storage, computing, network, and electrical power resources while at the same time meeting end-user expectations for data access latencies which may vary depending on how long ago the end-user accessed a content item. For example, an end-user that just uploaded a new content item to the system may expect to be able to access the content item quickly and immediately. However, an end-user may tolerate some extended access latency for a content item that the end-user uploaded to the system months or years ago.

As an example of a technical problem addressed by the systems and methods herein in some embodiments, consider a content management service or a content collaboration service that allows end-users to store, access, and share many types of content items including digital data, photos, text, audio, video, streaming content, etc. Such content items can be of different content types, of varying sizes, and be subject to different access patterns including access patterns that change over time. It is very difficult for the provider of the system to formulate and implement an effective heuristic or a set of heuristics for data storage scheme switching that effectively covers the myriad of content access patterns in the system. Thus, content item may be stored in a hotter storage for longer than necessary, switched from a hotter storage to colder storage prematurely, or not switched from colder storage to a hotter storage before access, resulting in inefficient utilization of computing, storage, networking, and electrical power resources of the system and/or not meeting end-users' reasonable data access latency expectations. As such, appropriately timed switching of content items between data storage schemes is important.

Timely and appropriate data storage scheme switching of content items is not only important to the provider of the system, which wants to best utilize the limited data storage, network, computing, and electrical power resources of the system, but also to end-users who want to be able to access their content items as soon as practical. For example, if a content item remains in a hotter storage even though it won't be accessed again for some time, it consumes space in a hotter storage that could have been used to store another content item that is more likely to be accessed sooner. The content item could have been switched to colder storage sooner. And as mentioned, end-users that have not accessed their content items in some time (e.g., months or years) may tolerate some additional access latency. At the same time, end-user may expect to access new content items immediately after they uploaded to the system for storage. Systems and methods disclosed herein address these and other issues.

As another example of how the timing of data storage scheme switching is important, a content item in a colder storage that is likely to be accessed during peak business hours could be switched to a hotter storage before the access. Conversely, a content item stored in a hotter storage that is likely to be accessed only during off-peak hours in the future (e.g., only on the weekends, only after-hours) could be switched to a colder storage to make room in the hotter storage for content items more likely to be accessed during peak hours.

According to some embodiments, systems and methods disclosed herein provide for better (e.g., more timely) dynamic and automatic switching of content items between hotter and colder data storage schemes.

Example Technical Solutions and Example Technical Effects Thereof

In some embodiments, the systems and methods use a machine learning-based approach to compute probabilities of various content items being accessed within various time periods in the future. Those computed probabilities are used to dynamically and automatically switch content items between different data storage schemes. As a result, content items are timely switched between different data storage schemes (e.g., between a hotter storage and colder storage) according to their probable future access patterns.

In some embodiments, the systems and methods proceed by collecting content item access predictors (sometimes referred to herein as just "predictors") from many previous content item accesses (e.g., uploads, views, edits, etc.). For example, thousands, millions, billions, or more content item accesses (sometimes referred to herein as just "accesses") to various content items stored in the system may have been made on a previous day or over previous weeks, months, or years and the access patterns in those accesses as well as characteristics of the end-users requesting the accesses and characteristics of the content items accessed may be collected as predictors.

In some embodiments, content item access features (sometimes referred to herein as just "features") are then extracted from the predictors collected, and feature representations (e.g., feature vectors) of the features are generated for training one or more machine learning models (e.g., one or more gradient boosting trees, one or more artificial neural networks, etc.). For example, a feature representation may be generated for a content item accessed that reflects various predictors pertaining to the content item. Such predictors may include all of the following predictors, or a superset of the predictors, or a subset of all or a superset:
  the content type of the content item (e.g., as reflected by a file extension associated with the content item),
  access timing data such as the hour(s) of the day of historical access(es) of the content item,
  access timing data such as the day(s) of the week of historical access(es) of the content item,
  access timing data such as the month(s) of the year of historical access(es) of the content item,
  a size of the content item,
  a file path or a file name of the content item as hosted in a centrally-hosted network file system;
  a number of previous access(es) of the content item such as, for example, a number of previous access(es) by a particular user or by any user, and
  types of end-user computing devices used in historical accesses (e.g., mobile vs desktop vs web browser) of the content item.

In some embodiments, one or more machine learning models are learned based on the extracted features to compute a probability for a content item to be accessed in a future period of time. If the content item is likely to be accessed in the future period of time, then the content item may remain in a hotter storage or potentially switched to even a hotter storage. Alternatively, if the content item is currently in colder storage, it may be switched to a hotter storage. On the other hand, if the content item is unlikely to be accessed in the future time period, then the content item may be switched to colder storage or, if the content item is currently in colder storage, it may remain in colder storage, or potentially switched to even colder storage. By doing so, a content item that is likely to be accessed in the future time period remains or is switched to a hotter storage having a lower data access cost. And a content item that is unlikely to be accessed in the future time period remains or is switched to colder storage having a lower data storage cost.

In some embodiments, one or more models are learned based on the extracted features to compute a probability for a given content item to be accessed only during off-peak time periods (e.g., on the weekends, early in the morning) in a future period of time. If the content item is likely to be accessed only during off-peak time periods in the future period of time, then the content item may remain in colder storage or potentially switched to even colder storage. Alternatively, if the content item is currently in a hotter storage, it may be switched to colder storage.

On the other hand, if the content item is likely to be accessed during on-peak time periods (e.g., during regular business hours) in the future time period, then the content item may be switched to a hotter storage or, if the content item is currently in a hotter storage, it may remain in a hotter storage, or potentially switched to an even hotter storage. By doing so, a content item that is likely to be accessed only during off-peak time periods remains or is switched to a colder storage having a lower data storage cost. And a content item that is likely to be accessed during on-peak time periods remains in a hotter storage having a lower data access cost, switched to a hotter storage, or switched to an even hotter storage.

Content Itent Access Pattern Modeling

After a content item is stored in the system, subsequent accesses of the content item in the system typically are not random. Instead, the subsequent accesses may follow a pattern. For example, subsequent accesses of the content item may follow a usage pattern of the content item by an end-user. According to some embodiments, an approach to modeling content item access involves learning one or more models to compute probabilities of whether content items will be accessed during future periods of time.

FIG. 1 depicts example content item access pattern modeling 100 for a content item stored in the system, according to some embodiments. In some embodiments, a probability of the content item being accessed in the system during future period of time 110 can be computed for the content item based on historical accesses 108 of the content item in the system. Future period of time 110 for the content item can correspond to a period of time between reference time 104 for the content item and horizon time 106 for the content item. Reference time 104 for the content item can be some point in time after initial time 102 of the content item yet before horizon time 106 for the content item.

Initial time 102 of the content item represents when an instance of the content item is created, modified, or configured in the system. For example, initial time 102 of the content item may correspond to approximately when any of the following events occur:

an end-user uploads the content item to the system for storage in the system, the content item is stored in the system, the content item is replicated in the system (e.g., 3-times replicated), the content item is erasure-coded in the system, the content item is modified in the system, a content management system takes a content management action on the content item, or the content item is switched or copied from one data storage scheme to another data storage scheme.

The content item can have multiple various initial times throughout the content item's lifetime in the system. For example, the content item can have initial time 102 corresponding to approximately when an end-user uploaded or provided the content item for storage in the system. The content item can have initial time 102 corresponding to approximately when the content item is stored in the system. The content item can have initial time 102 corresponding to approximately when the content item is modified or updated in the system. The content item can have an initial time 102 corresponding to approximately when the content item is 3-times replicated in the system. The content item can have an initial time 102 corresponding to approximately when the content item is erasure-coded in the system. The content item can have an initial time 102 corresponding to approximately when the content item is switched from one data storage scheme to another. Initial time 102 of the content item can correspond to any of these times.

In some embodiments, initial time 102 corresponds to when a content item under management of a content management system (e.g., content managements system 1000 of FIG. 10 described below) undergoes a content management action performed by the content management system and caused by an end-user of the content management system. Such content management action may include, for example, an end-user sharing the content item with another end-user of the content management system (e.g., via sharing module 1030). Other possible content management actions that may correspond to initial time 102 for a content item include, but are not limited to, an end-user using the content management system to favorite or like the content item, an end-user using the content management system to comment on the content item, the end-user using the content management system to search for the content item that is listed in the search results for the search, or an end-user taking an action on the content item using the content management system that does not require the content management system to access to the content item itself in order to carry out the action.

When the content item is used as a training example for learning a model or when a learned model is used to compute a probability of future access of the content item, reference time 104 for the content item divides what is considered the past for the content item and what is considered the future for the content item. The past of the content item is represented by historical accesses 108 between initial time 102 for the content item and reference time 104 for the content item. The future of content item corresponds to a forward-looking future period of time 110 between reference time 104 for the content item and horizon time 106 for the content item.

Historical accesses 108 represent when and how frequently the content item was accessed in the system between initial time 102 of the content item and reference time 104 for the content item. Depending on which historical access features are used during learning and inference, historical accesses 108 may include an access of the content item in the system (e.g., a create of the content item in the system) associated with initial time 102 of the content item and all or a selected subset of all subsequent accesses of the content item in the system (e.g., all reads, updates, and deletes of the content item in system) between initial time 102 of the content item and reference time 104 for the content item.

Historical accesses 108 may include just a subset of all accesses of the content item in the system between initial time 102 of the content item and reference time 104 for the content item. For example, all of the accesses, historical accesses 108 may include just a selected or predetermined number of the most recent accesses, only read accesses, only read and write accesses, a selected or predetermined number of the most recent read accesses, a selected or predetermined number of the most recent read and write accesses, or other selected subset of accesses.

According to some embodiments, reference time 104 for the content item is model-specific. For example, a model may be used to compute a probability that the content item that has been stored in the system for three days since initial time 102 of the content item will be accessed in the future within seven days since initial time 102 of the content item. In this example, three days after initial time 102 of the content item is the content item's reference time 104. The model-specific length of the period of time between initial time 102 and reference time 104 is referred to herein as the model's "reference time delta." Returning to the example, the example model's reference time delta is three days. The model-specific length of the period of time between initial time 102 and horizon time 106 is referred to herein as the model's "horizon time delta." Again, returning to the example, the example model's horizon time delta is seven days (or four days relative to the reference time delta).

According to some embodiments, different models have different reference time deltas and different horizon time deltas. For example, a first model may be used to compute a probability that the content item that has been stored in the system for three days since initial time 102 of the content item will be accessed in the future within thirty days since initial time 102 of the content item and a second model may be used to compute a probability that the content item that has been in the system for seven days since initial time 102 of the content item will be accessed in the future within thirty days since initial time 102 of the content item.

According to some embodiments, the notation M(X|Y) is used to refer to a model for computing a probability that the content item that has been stored in the system for X length of time since initial time 102 of the content item will be accessed in the future within Y length of time since initial time 102 of the content item where Y is greater than X, and X is model M's reference time delta and Y is model M's horizon time delta. X and Y can be minutes, hours, days, or other units of time. For example, the example first model can be referred to as M(3 days|30 days) and the example second model can be referred to as M(7 days|30 days).

While in some embodiments horizon time 106 is defined as a numerical value representing a specified length of time (e.g., 30 days), horizon time 106 is not specified in other embodiments. In these embodiments, horizon time 106 may be considered to be infinitely into the future such that future period of time 110 is considered to encompass all time after reference time 104. In these embodiments, horizon time delta may be considered to be infinitely long.

According to some embodiments, training a model for content item access pattern prediction according to general content item access pattern modeling 100 involves use of a set of positive training examples and a set of negative training examples to train the model according to a machine learning algorithm. For example, the machine learning algorithm may be a gradient boosted decision tree algorithm.

One non-limiting example of a gradient boosted decision tree algorithm that may be used is known as the XGBoost algorithm described in the following paper, the entire contents of which is hereby incorporated by reference: T. Chen and C. Guestrin, "XGBoost: A Scalable Tree Boosting System," In Proc. of the $22^{nd}$ ACM Intl. Conf. on Knowledge Discover and Data Mining (SIGKDD), pages 785-794, ACM 2016.

While in some embodiments a gradient boosted decision tree algorithm is used to train a model according to general content item access pattern modeling 100, a Support Vector Machine (SVM), an Artificial Neural Network (ANN), or other suitable machine learning algorithm is used in other embodiments.

While in some embodiments one of the above-mentioned machine learning algorithms are used, a logistic regression algorithm is used in other embodiments that allows for thresholding directly on the computed probability and empirical tuning of the threshold for classifying probabilities into a switch or do not switch decision.

According to some embodiments, a training example corresponds to a content item stored in the system. The label of the training example may vary depending on whether the training example is a positive training example or a negative training example. A positive training example can be one where the corresponding content item was accessed (e.g., read or updated) in the system during future period of time 110 for the content item. A negative training example can be one where the corresponding content item was not accessed in the system during future period of time 110 for the content item. For example, a positive training example can have a label of 1 and a negative training example can have a label of 0.

While in some embodiments a model is trained as a classifier to compute a continuous value in the form of a probability for a class label, a model is trained by a regression algorithm to predict a continuous quantity in other embodiments. For example, a model may be trained by a regression algorithm to compute a number of units of time (e.g., number of days) in the future relative to initial time 102 for a content item or relative to reference time 104 for the content item and within future period of time 110 for the content item that the content item will be accessed in the system. For example, the model may be trained with a set of content item training examples. Training examples in the set may have the same reference time deltas and the same horizon time deltas. Positive training examples in the set may have labels that specify a number of units of time (e.g., a number of days) in the future relative to initial time 102 for the content item or relative to reference time 104 for the content item and within future period of time 110 for the content item that the content item was accessed in the system after reference time 104 for the content item. Negative training examples in the set may have labels that specify 0 or −1 or other suitable value to indicate that the content item was not accessed in the system within future period of time 110 for the content item.

As another example using a regression algorithm to predict a continuous quantity, a model may be trained by a regression algorithm that uses a quantile loss function to compute (predict) a quantile (e.g., the $95^{th}$ quantile or about) of the expected lifetime of a content item relative to initial time 102 for the content item or relative to reference time 104 for the content item.

Accordingly, reference herein to computing a probability (e.g., as by a classifier) can be substituted with computing a continuous quantity (e.g., as by a regression algorithm)

without loss of generality, unless the context clearly indicates otherwise. For example, at inference, a learned model may output a continuous quantity for an input content item such as an expected lifetime for the content item at a selected percentile. Depending on the continuous quantity output, the content item may be switched from a current data storage scheme to a different data storage scheme. For example, if the output is an expected lifetime for the content item at the 95$^{th}$ percentile and if the content item is currently stored in a hotter storage, then the content item may be scheduled to be automatically switched to a colder storage at the end of that expected lifetime.

Model Chains

According to some embodiments, multiple models are chained together to compute multiple future access probabilities for a content item. In a multi-model chain, models can be ordered and evaluated in increasing order of their respective reference time deltas. The respective reference time delta for a model earlier in the chain can be shorter than the respective reference time delta for a model later in the chain. That is, the respective time deltas of the models in the chain can be strictly increasing in order of the models in the chain.

Model chains may be used to timely switch a content item between different data storage schemes while overcoming the technical difficulties in learning a single model that can generalize well to different reference time deltas and different horizon time deltas. Instead, each model in a chain may be trained with a set of training examples all having the same reference and horizon time deltas. According to some embodiments, a model chain is useful for early identification of content items that should be switched from hotter to colder storage and for just-in-time identification of content items that should be switched from colder to hotter storage.

For example, one model chain might include a first model M(3 days|30 days) and a second model M(7 days|30 days). If a first probability computed by the first model for a content item at day three after creation is such that the content item should be switched to a different data storage scheme from its current data storage scheme, then the content item may then be switched to the different data storage scheme. However, if the first probability is such that the content item should not be switched to the different data storage scheme, then a second probability may be computed by the second model for the content item at day seven after creation. Depending on the second probability, the content item may or may not be switched then to the different data storage scheme. In this example, the first model is trained based on a first set of content item training examples with reference time deltas at three days and horizon time deltas at 30 days and the second model is trained based on a second set of content item training examples with reference time deltas at 7 days and horizon time deltas at 30 days.

Example Model Chain

Figure 2:
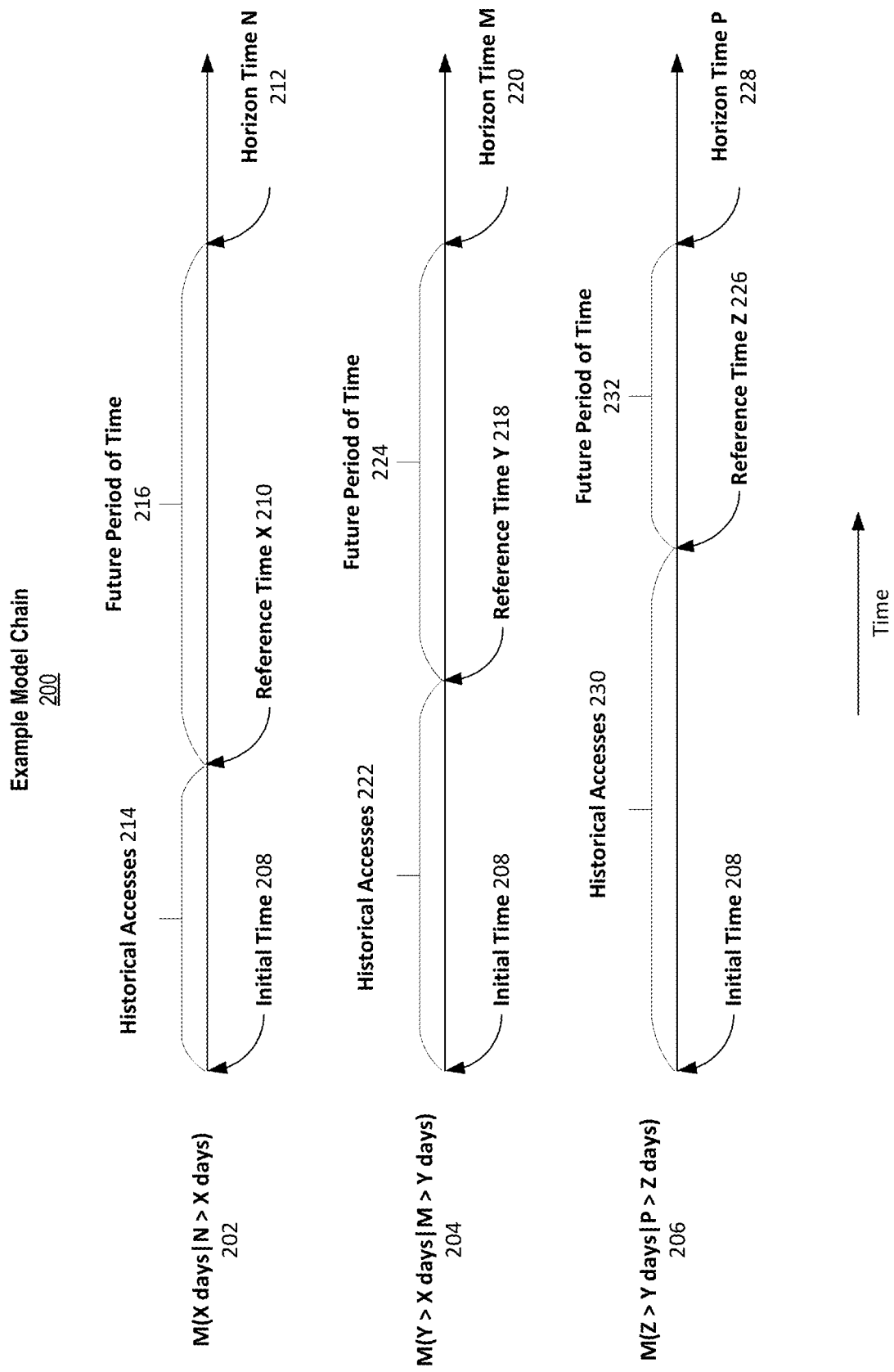
FIG. 2 illustrates an example model chain, according to some embodiments.

FIG. 2 illustrates example model chain 200, according to some embodiments. In this example, chain 200 includes three learned models 202, 204, and 206. However, a model chain could include as few as one learned model or more than three learned models, in some embodiments.

First model 202 in chain 200 is capable of computing a probability of access of a given content item in the system during future period of time 216 where the content item has been stored in the system for X length of time (e.g., X equals 3 days) since initial time 208 of the content item in the system. Likewise, second model 204 in chain 200 is capable of computing a probability of access of a given content item in the system during future period of time 224 for the content item where the content item has been stored in the system for Y greater than X length of time (e.g., Y equals 7 days) since initial time 208 of the content item in the system. Similarly, third model 206 in chain 200 is capable of computing a probability of access of a given content item in the system during future period of time 232 for the content item where the content item has been stored in the system for Z greater than Y length of time (e.g., Z equals 30 days) since initial time 208 of the content item in the system.

First model 202 computes the probability of access of the content item based on historical accesses 214 of the content item in the system between initial time 208 of the content item in the system and reference time X 210 for the content item. For example, reference time X 210 for the content item may be three days after initial time 208 of the content item.

Likewise, second model 204 computes the probability of access of the content item based on historical accesses 222 of the content item in the system between initial time 208 of the content item in the system and reference time Y 218 for the content item. For example, reference time Y 218 for the content item may be seven days after initial time 208 of the content item.

Similarly, third model 206 computes the probability of access of the content item based on historical accesses 230 of the content item in the system between creation 208 of the content item in the system and reference time Z 226 for the content item. For example, reference time Z 226 for the content item may be thirty days after initial time 208 of the content item.

The horizon time deltas for different models in a model chain may be the same. For example, returning to the current example, each of horizon times N 212, M 220, and P 228 might be two-hundred and seventy (270) days after initial time 208 of the content item. However, it is also possible for the horizon time deltas to be different. For example, returning to the current example, horizon time N 212 might be ninety (90) days after initial time 208 of the content item and horizon time M 220 and horizon time P 288 might each be two-hundred and seventy (270) days after initial time 208 of the content item.

According to some embodiments, models 202, 204, and 206 are evaluated in turn to determine whether and when to switch a given content item from hotter storage to colder storage or from colder storage to hotter storage. For example, model 202 is used at reference time X 210 for the content item (e.g., 3 days after initial time 208 of the content item) to compute a first probability of access of the content item in the system during future period of time 216 for the content item (e.g., between 3 and 90 days after initial time 208 of the content item). For example, if the first probability is such that the given content item should not then switch data storage schemes, then model 204 is next used at reference time Y 218 for the content item (e.g., 7 days after initial time 208 of the content item) to compute a second probability of access of the content item during future period of time 224 for the content item (e.g., between 7 and 270 days after initial time 208 of the content item). If the second probability is such that the given content item should not then switch data storage schemes, then model 206 is next used at reference time Z 226 for the content item (e.g., 30 days after initial time 208 of the content item) to compute a third probability of access of the content item during future period of time 232 for the content item (e.g., between 30 and 270 days after initial time 208 of the content item).

In some embodiments, the selection of the number of models in a model chain is based on a variety of different factors including based on balancing between (a) switching a content item from one storage scheme to another as soon as possible after it can be determined that switch should be made and (b) the amount of computing resources allocated to applying models to content items. More models in a model chain requires more computing resources to apply the models to content items. However, more models allow for sooner determination that a data storage scheme switch should be made. For example, if chain 200 included just model 202 and model 206 and did not include model 204, then no model is applied at reference time Y 218 for the content item. As a result, a content item that model 204 could have identified as one that should be switched at reference time Y 218 for the content item is not identified as such until later at reference time Z 226 for the content item when model 206 is applied to the content item. As result, the content item is not switched between data storage schemes until reference time Z 226 for the content item where. If the chain included model 204, then it could have been switched earlier at reference time Y 218 for the content item. Meanwhile, between reference time Y 218 for the content item and reference time Z 226 for the content item the content item was not stored according to the most appropriate (e.g., cost-effective) data storage scheme.

In some embodiments, the selection of reference time deltas and horizon time deltas for models is based on a variety of different factors including whether the model is used to determine whether a content item should be switched from hotter storage to colder storage or from colder storage to hotter storage. For example, after a content item is stored in hotter storage, it can be beneficial to switch the content item to colder storage as soon as it can be determined that the content item will not be accessed in the future for an extended period of time. Thus, a model for identifying content items that should be switched from hotter storage to colder storage may have a relatively short reference time delta and a relatively long horizon time delta. On the other hand, a content item stored in colder storage can remain in colder storage until just before it is expected to be accessed. Thus, a model for identifying content item that should be switched from colder storage to hotter storage may have a relatively long reference time delta and a relatively short horizon time delta.

While in some embodiments reference time deltas and horizon time deltas are measured in numbers of days, reference time delta and horizon time deltas are measured in other units of time in other embodiments. For example, a reference time delta or a horizon time delta can be a number of seconds, minutes, hours, or other unit of time.

Off-Peak Only Access Prediction Method

According to some embodiments, a content item stored in a hotter storage is switched to a colder storage based on a computed probability that the content item is likely to be accessed in the future only during off-peak periods. Off-peak periods are hours of the day when the system typically receives less network traffic (fewer requests) from end-user computing devices for access to content items than during on-peak periods. For example, off-peak periods may include the weekends or hours outside of the peak business hours during the middle of the day on weekdays. For example, off-peak periods may include all weekend days and holidays and all hours of non-holiday weekdays except between the hours of 10 am to 3 pm Monday through Friday. In this example, on-peak periods are between the hours of 10 am to 3 pm on Monday through Friday except on holidays. However, it should be understood that this is just an example of on-peak and off-peak periods. Other on-peak and off-peak periods are possible, and no particular on-peak and off-peak periods are required. For example, on-peak periods can correspond to when the system receives the greatest number of content item access requests or when a network provider charges the most to use a provided network. Off-peak periods can correspond to all non on-peak periods. As another example, on-peak or off-peak periods can be determined based on measuring inbound and/or outbound network traffic to and/or from an online service. Based on the measuring, periods of time when the amount of network traffic is below or above a threshold can identified. For example, a multi-hour period when the average number of inbound and outbound bytes per minute is below an average bytes per minute threshold can be identified. These periods of time when the amount of network traffic is below a threshold can be considered off-peak periods. Likewise, a period of time when the amount of network traffic is above a threshold can be considered an on-peak period.

By switching the content item from the hotter storage to the colder storage a data access cost for that content item may increase. For example, a data redundancy scheme of the colder storage may consume more network bandwidth to access the content item in the colder storage than to access the content item the hotter storage. However, the access of the content item in the colder storage is likely to be during off-peak periods when the monetary cost to the provider of the system to use the extra network bandwidth is lower. For example, the network provider may charge less to use the network during off-peak periods than during on-peak periods. At the same time, by switching the content item from the hotter storage to the colder storage, data storage space in the hotter storage is conserved for other content items including content items that are more likely to be accessed during on-peak periods. Switching content items to a colder storage that consumes more network bandwidth for accesses may also be useful to ensure that a fixed amount of bandwidth purchased from the network provider is actually consumed and not wasted.

Figure 3:
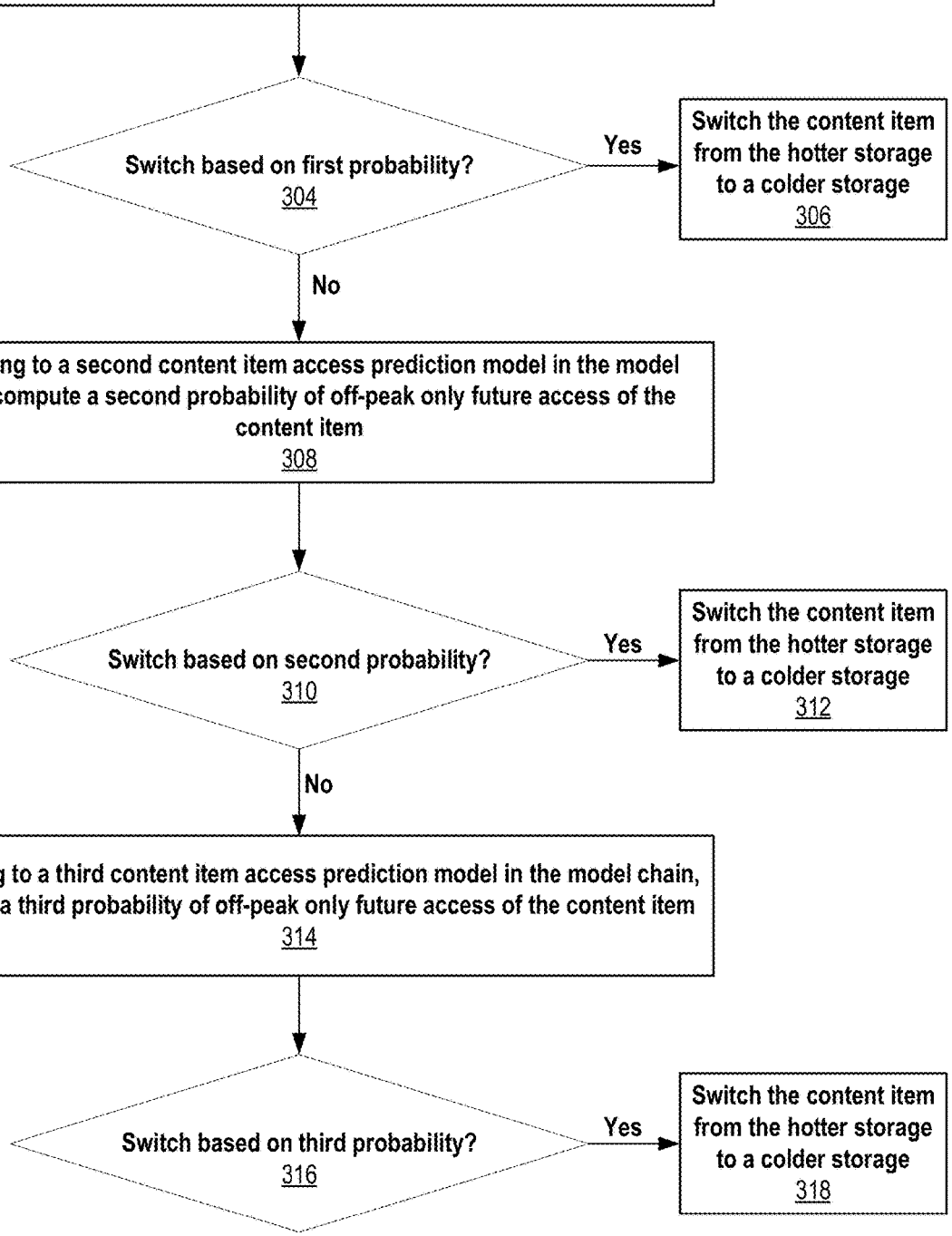
FIG. 3 illustrates an example off-peak only access pattern prediction method, according to some embodiments.

FIG. 3 depicts example method 300 for computing whether a content item stored in a hotter storage is likely to be accessed in a future period of time only during off-peak time periods, according to some embodiments. Example method 300 is described with respect to example model chain 200 of FIG. 2. However, a like method for computing whether the content item is likely to be accessed in a future period of time only during off-peak time periods can be performed with fewer (e.g., 1 or 2) or more (four or more) models of a model chain.

At operation 302, at or approximately at reference time X 210 for the content item, a first probability is computed for the content item. The first probability is computed using model 202. The first probability is a probability that the content item will be accessed only during off-peak time periods during future period of time 216 for the content item. The first probability is computed based on features of historical accesses 214 of the content item in the system between initial time 208 of the content item and reference time X 210 for the content item. For example, the features of historical accesses 214 of the content item based on which the first probability is computed may include, but are not limited to, a number of accesses of the content item in the system during on-peak periods and a number of accesses of the content item during off-peak periods between initial time 208 of the content item and reference time X 210 for the content item.

According to some embodiments, the features of historical accesses 214 of the content item based on which the first probability is computed 302 include, but are not limited to, a ratio of a number of accesses of the content item in the system during on-peak periods and a number of accesses of the content item in the system during off-peak periods between initial time 208 of the content item and reference time X 210 for the content item. Other features based on which the first probability is computed may include, but are not limited to, the type (file extension) of the content item, the hour of the day of initial time 208 of the content item, and/or the size (e.g., in bytes) of the content item at initial time 208 of the content item.

While in some embodiments the accesses of historical accesses 214 of the content item from which features are extracted encompass all historical accesses 214 of the content item between initial time 208 of the content item and reference time X 210 for the content item, the accesses of historical accesses 214 of the content item from which features are extracted is a subset of all historical accesses 214 of the content item in other embodiments. For example, the subset can be a number of the most recent historical accesses 214 of the content item relative to reference time X 210 for the content item and/or the subset can include only accesses of a certain access type (e.g., only read accesses or only write accesses).

At operation 304, a first determination is made whether to switch the content item from the hotter storage to a colder storage. The first determination is made based on the first probability computed 302. For example, if the first probability indicates that it is more likely than not (e.g., greater than 50% probability) that the content item will be accessed only during off-peak periods during future period of time 216, then the content item may be switched 306 from the hotter storage to a colder storage. The first determination may be based on comparing the first probability to a threshold probability where if the first probability is greater than the threshold probability, then the content item is switched 306 from the hotter storage to the colder storage. In some embodiments, the threshold probability is greater than 50% (e.g., 80% or 90%) to reduce or eliminate the number of content items switched 306 incorrectly to colder storage that end up being accessed during future period of time 216 during on-peak periods.

If it is determined 304 not to switch the content item from the hotter storage to a colder storage, then, at operation 308, at or approximately at reference time Y 218 for the content item, a second probability is computed for the content item stored in the hotter storage. The second probability may be computed like the first probability at operation 302 except using model 204 and with respect to historical accesses 222 of the content item, reference time Y 218 for the content item, future period of time 224 for the content item, and horizon time 220 for the content item. Note that the second probability may take into account any historical accesses 222 of the content item that occurred after reference time X 210 for the content item and before reference time Y 218 for the content item which the first probability did not take into account. In addition, historical accesses 222 of the content item may include accesses of historical accesses 214 of the content item taken into account when computing 302 first probability using model 202.

At operation 310, a second determination is made whether to switch the content item from the hotter storage to a colder storage. The second determination may be made based on the second probability computed 308, like the first determination 304 is made based on the first probability computed 302. If it is decided based on the second probability to switch the content item, then the content item is switched 312 from the hotter storage to a colder storage. Otherwise, the content item remains stored in the hotter storage.

If it is determined 310 not to switch the content item from the hotter storage to a colder storage, then, at operation 314, at or approximately at reference time Z 226 for the content item, a third probability is computed for the content item stored in hotter storage. The third probability may be computed like the first probability at operation 302 except using model 206 and with respect to historical accesses 230 of the content item, reference time Z 226 for the content item, future period of time 232 for content item, and horizon time 228 for the content item. Note that the third probability may take into account any historical accesses 230 of the content item that occurred after reference time Y 218 for the content item and before reference time Z 226 for the content item which the first probability and the second probability did not take into account. In addition, historical accesses 230 of the content item may include accesses of historical accesses 214 of the content item taken into account when computing 302 first probability using model 202 and accesses of historical accesses 222 of the content item taken into account when computing 308 second probability using model 204.

At operation 316, a third determination is made whether to switch the content item from the hotter storage to a colder storage. The third determination may be made based on the third probability computed 314, like the first determination 304 and the second determination 310 are made based on the first probability computed 302 and the second probability computed 308, respectively. If it is decided based on the third probability to switch the content item, then the content item is switched 318 from the hotter storage to a colder storage. Otherwise, the content item remains stored in the hotter storage.

If it is determined 316 not to switch the content item from the hotter storage to a colder storage, then the content item can remain in hotter storage and evaluated again in the future for potential switching. The content item may also be switched to colder storage after a predetermined amount of time to make room in the hotter storage for newer content items. For example, referring to model chain 200 of FIG. 2, horizon times N, M, and P may each be 90 days after initial time 208 of the content item. And if it is determined 316 not to switch the content item from the hotter storage to a colder storage, then the content item may be switched automatically at 270 days after initial time 208 of the content item.

On-Peak Access Prediction Method

According to some embodiments, a content item stored in a colder storage is switched to a hotter storage based on a computed probability that the content item will be accessed in the future during on-peak periods. By switching the content item from the colder storage to a hotter storage a data access cost may decrease. For example, a data redundancy scheme of a hotter storage may consume less network bandwidth to access the content item in a hotter storage than the network bandwidth consumed to access the content item the colder storage. However, some accesses of the content item in a hotter storage will probably be during on-peak periods when the monetary cost to the provider of the system to use the extra network bandwidth is higher. For example, the network provider may charge more to use the network during on-peak periods than during off-peak periods. At the same time, by switching the content item from the colder storage to a hotter storage, less on-peak network bandwidth is consumed when providing access to the content item than if the access were to be provided from the colder storage.

Figure 4:
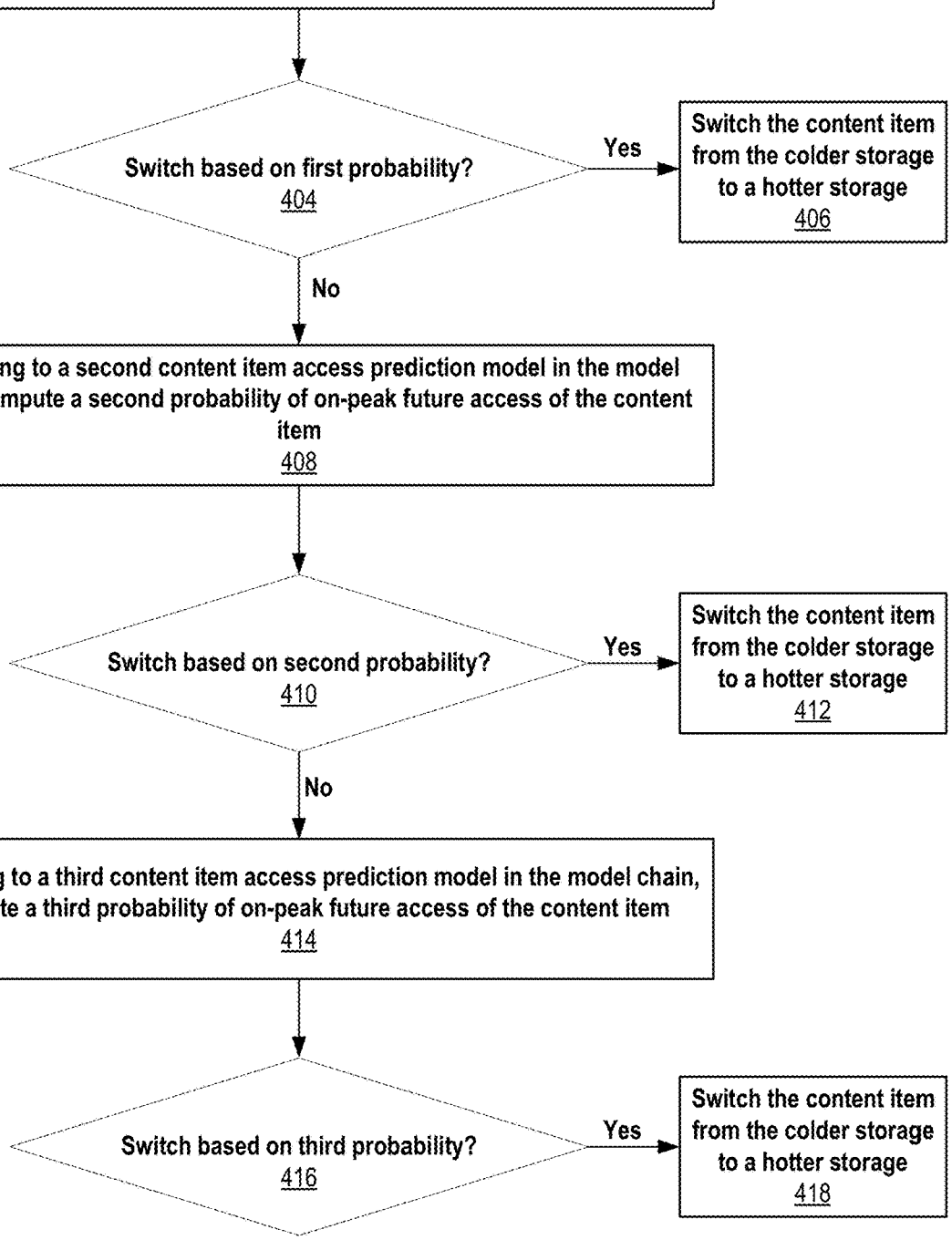
FIG. 4 illustrates an example on-peak access pattern prediction method, according to some embodiments.

FIG. 4 depicts example method 400 for computing whether a content item stored in a colder storage is likely be accessed in a future period of time during on-peak time periods, according to some embodiments. Example method 400 is described with respect to example model chain 200 of FIG. 2. However, a like method for computing whether the content item is likely to be accessed in a future period of time during on-peak time periods can be performed with fewer (e.g., 1 or 2) or more (four or more) models of a model chain.

At operation 402, at or approximately at reference time X 210 for the content item, a first probability is computed for the content item. The first probability is computed using model 202. The first probability is a probability that the content item will be accessed during on-peak time periods during future period of time 216 for the content item. The first probability is computed based on features of historical accesses 214 of the content item in the system between initial time 208 of the content item and reference time X 210 for the content item. For example, the features of historical accesses 214 of the content item based on which the first probability is computed may include, but are not limited to, a number of accesses of the content item in the system during on-peak periods and a number of accesses of the content item during off-peak periods between initial time 208 of the content item and reference time X 210 for the content item.

According to some embodiments, the features of historical accesses 214 of the content item based on which the first probability is computed include, but are not limited to, a ratio of a number of accesses of the content item in the system during on-peak periods and a number of accesses of the content item in the system during off-peak periods. Other features based on which the first probability is computed may include, but are not limited to, the type (file extension) of the content item, the hour of the day of initial time 208 of the content item, and/or the size (e.g., in bytes) of the content item at initial time 208 of the content item.

While in some embodiments the accesses of historical accesses 214 of the content item from which features are extracted encompass all historical accesses 214 of the content item between initial time 208 of the content item and reference time X 210 for the content item, the accesses of historical accesses 214 of the content item from which features are extracted is a subset of all historical accesses 214 of the content item in other embodiments. For example, the subset can be a number of the most recent historical accesses 214 of the content item and/or the subset can include only accesses of a certain access type (e.g., only read accesses or only write accesses).

At operation 404, a first determination is made whether to switch the content item from the colder storage to a hotter storage. The first determination is made based on the first probability computed 402. For example, if the first probability indicates that it is more likely than not (e.g., greater than 50% probability) that the content item will be accessed during on-peak periods during future period of time 216 for the content item, then the content item may be switched 406 from the colder storage to a hotter storage. The first determination may be based on comparing the first probability to a threshold probability where if the first probability is greater than the threshold probability, then the content item is switched 406 from the colder storage to a hotter storage. In some embodiments, the threshold probability is less than 50% (e.g., 40% or 25%) to reduce or eliminate the number of content items that are not switched 406 to a hotter storage (remain in the colder storage) that end up being accessed in the colder storage during future period of time 216 for the content items during on-peak periods when a data access cost of the colder storage may be greater than during off-peak periods. If the content item is not switched 406, then the content item remains stored in the colder storage.

If it is determined 404 not to switch the content item from the colder storage to a hotter storage, then, at operation 408, at or approximately at reference time Y 218 for the content item, a second probability is computed for the content item stored in the colder storage. The second probability may be computed like the first probability at operation 402 except using model 204 and with respect to historical accesses 222 of the content item, reference time Y 218 for the content item, future period of time 224 for the content item, and horizon time 220 for the content item. Note that the second probability may take into account any historical accesses 222 of the content item that occurred after reference time X 210 for the content item and before reference time Y 218 for the content item which the first probability did not take into account. In addition, historical accesses 222 of the content item may include accesses of historical accesses 214 of the content item taken into account when computing 402 first probability using model 202.

At operation 410, a second determination is made whether to switch the content item from the colder storage to a hotter storage. The second determination may be made based on the second probability computed 408, like the first determination 404 is made based on the first probability computed 402. If it is decided based on the second probability to switch the content item, then the content item is switched 412 from the colder storage to a hotter storage. Otherwise, the content item remains stored in the colder storage.

If it is determined 410 not to switch the content item from the colder storage to a hotter storage, then, at operation 414, at or approximately at reference time Z 226 for the content item, a third probability is computed for the content item stored in the colder storage. The third probability may be computed like the first probability at operation 402 except using model 206 and with respect to historical accesses 230 of the content item, reference time Z 226 for the content item, future period of time 232 for the content item, and horizon time 228 for the content item. Note that the third probability may take into account any historical accesses 230 of the content item that occurred after reference time Y 218 for the content item and before reference time Z 226 for the content item which the second probability did not take into account. In addition, historical accesses 230 of the content item may include accesses of historical accesses 214 of the content item taken into account when computing 402 first probability using model 202 and accesses of historical accesses 222 of the content item taken into account when computing 408 second probability using model 204.

At operation 416, a third determination is made whether to switch the content item from the colder storage to a hotter storage. The third determination may be made based on the third probability computed 414, like the first determination 404 and the second determination 410 are made based on the first probability computed 402 and the second probability computed 408, respectively. If it is decided based on the third probability to switch the content item, then the content item is switched 418 from the colder storage to a hotter storage. Otherwise, the content item remains stored in the colder storage.

If it is determined 416 not to switch the content item from the colder storage to a hotter storage, then the content item can remain in the colder storage and evaluated again in the future for switching. Otherwise, the content item may remain stored in the colder storage, or potentially switched to even colder storage.

It should be noted that the models 202, 204, and 206 in model chain 200 for off-peak only access prediction method 300 may be more conservative about switching from a hotter to a colder storage than the models 202, 204, and 206 in model chain 200 for on-peak access prediction method 400 are for switching from a colder to a hotter storage. That is, given a greater data access cost of a colder storage, if a content item is switched from a hotter storage to the colder storage based on a computed probability 302, 308, or 314 that the content item will only be accessed during a future period of time during off-peak periods, then if that the content item ends up being accessed during the future period of time during on-peak periods, then the greater data access cost of the colder storage is incurred during on-peak periods, which may be undesirable. For example, a network provider may charge significantly more for network access during on-peak periods than for network access during off-peak periods. To avoid this type of false positive determination, models 204, 204, and 206 in model chain 200 for off-peak only access prediction method 300 may be trained with positive training examples that are weighted higher during training than negative training examples. For example, a training example for training model 202 may be considered a representative example of off-peak only access (negative example) only if the content item was not accessed at all during on-peak periods during future period of time 216 for the content item. On the other hand, if the content item was accessed at least once during on-peak periods during future period of time 216 for the content item, then the content item may be considered to be a positive training example.

Hotter to Colder Prediction Method

According to some embodiments, a content item stored in a hotter storage is switched to a colder storage based on a computed probability that the content item will not be accessed during an extended future period of time. By switching the content item from the hotter storage to the colder storage, data storage space in the hotter storage is conserved for other content items including newer content items that are more likely to be accessed during the future period of time.

Figure 5:
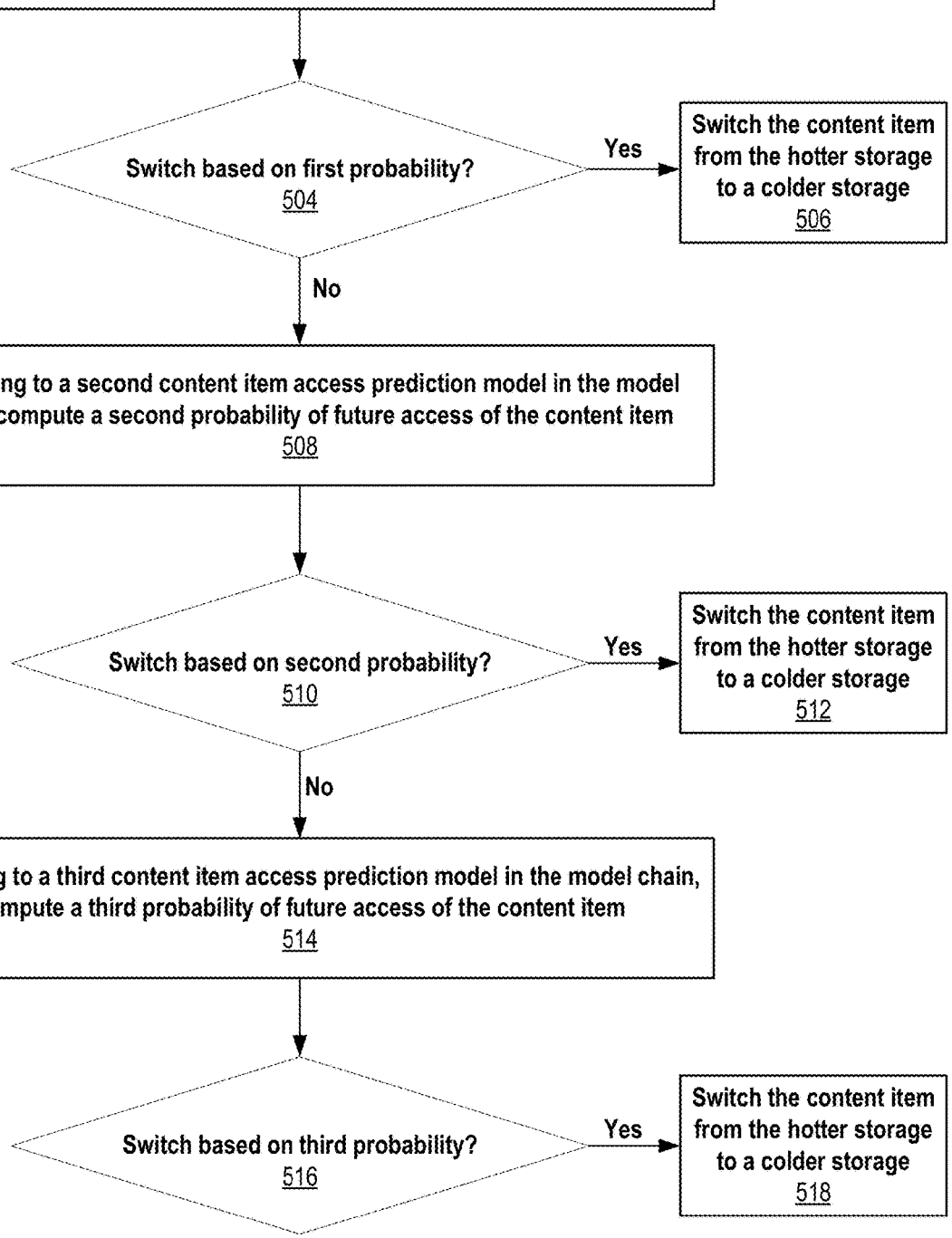
FIG. 5 illustrates an example hotter storage to colder storage access pattern prediction method, according to some embodiments.

FIG. 5 depicts example method 500 for computing whether a content item stored in a hotter storage is likely to be accessed in a future period of time, according to some embodiments. Example method 500 is described with respect to example model chain 200 of FIG. 2. However, a like method for computing whether the content item is likely to be accessed in a future period of time can be performed with fewer (e.g., 1 or 2) or more (four or more) models of a model chain. For example, according to some embodiments, a like method is performed in the context of the following example model chain that is provided solely for purposes of illustrating an example model chain and not as representative of model chains to which a method is limited:

1. M(3 days, 30 days)
2. M(7 days, 90 days)
3. M(30 days, 270 days)
4. M(60 days, 270 days)
5. M(90 days, 270 days)

At operation 502, at or approximately at reference time X 210, a first probability is computed for the content item stored in the hotter storage. The first probability is computed using model 202. The first probability is a probability that the content item will be accessed during future period of time 216 for the content item. The first probability is computed based on features of historical accesses 214 of the content item in the system prior to between initial time 208 of the content item and reference time X 210 for the content item. For example, the features of historical accesses 214 of the content item based on which the first probability is computed may include, but are not limited to, a number of read accesses (gets) of the content item in the system between initial time 208 of the content item and reference time X 210 for the content item and/or a number of update accesses (puts) of the content item in the system between initial time 208 of the content item and reference time X 210 for the content item. Other features based on which the first probability is computed may include, but are not limited to, the type (file extension) of the content item, the hour of the day of initial time 208 of the content item, and/or the size (e.g., in bytes) of the content item at initial time 208 of the content item.

While in some embodiments the accesses of historical accesses 214 of the content item from which features are extracted encompass all historical accesses 214 of the content item between initial time 208 of the content item and reference time X 210 for the content item, the accesses of historical accesses 214 of the content item from which features are extracted is a subset of all historical accesses 214 of the content item in other embodiments. For example, the subset can be a number of the most recent historical accesses 214 of the content item and/or the subset can include only accesses of a certain access type (e.g., only read accesses or only write accesses).

At operation 504, a first determination is made whether to switch the content item from the hotter storage to a colder storage. The first determination is made based on the first probability computed 502. For example, if the first probability indicates that it is more likely than not (e.g., greater than 50% probability) that the content item will be accessed during future period of time 216 for the content item, then the content item may remain in the hotter storage on expectation of the probable future access. However, if the first probability indicates that is unlikely that the content item will be accessed during future period of time 216 for the content item, then the content item may be switched 506 from the hotter storage to a colder storage. The first determination may be based on comparing the first probability to a threshold probability of future access where if the first probability is greater than the threshold probability, then the content item remains stored in the hotter storage. Otherwise, the content item is switched 506 from the hotter storage to the colder storage.

If it is determined 504 not to switch the content item from the hotter storage to a colder storage, then, at operation 508, at or approximately at reference time Y 218 for the content item, a second probability is computed for the content item stored in the hotter storage. The second probability may be computed like the first probability at operation 502 except using model 204 and with respect to historical accesses 222 of the content item, reference time Y 218 for the content item, future period of time 224 for the content item, and horizon time 220 for the content item. Note that the second probability may take into account any historical accesses 222 of the content item that occurred after reference time X 210 for the content item and before reference time Y 218 for the content item which the first probability did not take into account. In addition, historical accesses 222 of the content item may include accesses of historical accesses 214 taken into account when computing 502 first probability using model 202.

At operation 510, a second determination is made whether to switch the content item from the hotter storage to a colder storage. The second determination may be made based on the second probability computed 508, like the first determination 504 is made based on the first probability computed 502. If it is decided based on the second probability to switch the content item, then the content item is switched 512 from the hotter storage to a colder storage. Otherwise, the content item remains stored in the hotter storage.

If it is determined 510 not to switch the content item from the hotter storage to a colder storage, then, at operation 514, at or approximately at reference time Z 226 for the content item, a third probability is computed for the content item stored in the hotter storage. The third probability may be computed like the first probability at operation 502 except using model 206 and with respect to historical accesses 230 of the content item, reference time Z 226 for the content item, future period of time 232 for the content item, and horizon time 228 for the content item. Note that the third probability may take into account any historical accesses 230 of the content item that occurred after reference time Y 218 for the content item and before reference time Z 226 for the content item which the second probability did not take into account. In addition, historical accesses 230 of the content item may include accesses of historical accesses 214 of the content item taken into account when computing 502 first probability using model 202 and accesses of historical accesses 222 of the content item taken into account when computing 508 second probability using model 204.

At operation 516, a third determination is made whether to switch the content item from the hotter storage to a colder storage. The third determination may be made based on the third probability computed 514, like the first determination 504 and the second determination 510 are made based on the first probability computed 502 and the second probability computed 508, respectively. If it is decided based on the third probability to switch the content item, then the content item is switched 518 from the hotter storage to a colder storage. Otherwise, the content item remains stored in the hotter storage.

If it is determined 516 not to switch the content item from the hotter storage to a colder storage, then the content item can remain in the hotter storage and evaluated again in the future for switching. The content item may also be switched to a colder storage after a predetermined amount of time. For example, the content item may be switched automatically from the hotter storage to a colder storage at 270 days after initial time 208 of the content item to make room in the hotter storage for newer content items.

Colder to Hotter Prediction Method

According to some embodiments, a content item stored in a colder storage is switched to a hotter storage based on a computed probability that the content item will be accessed in the near feature. By switching the content item from the colder storage to the hotter storage, data access cost for the content item is reduced.

Figure 6:
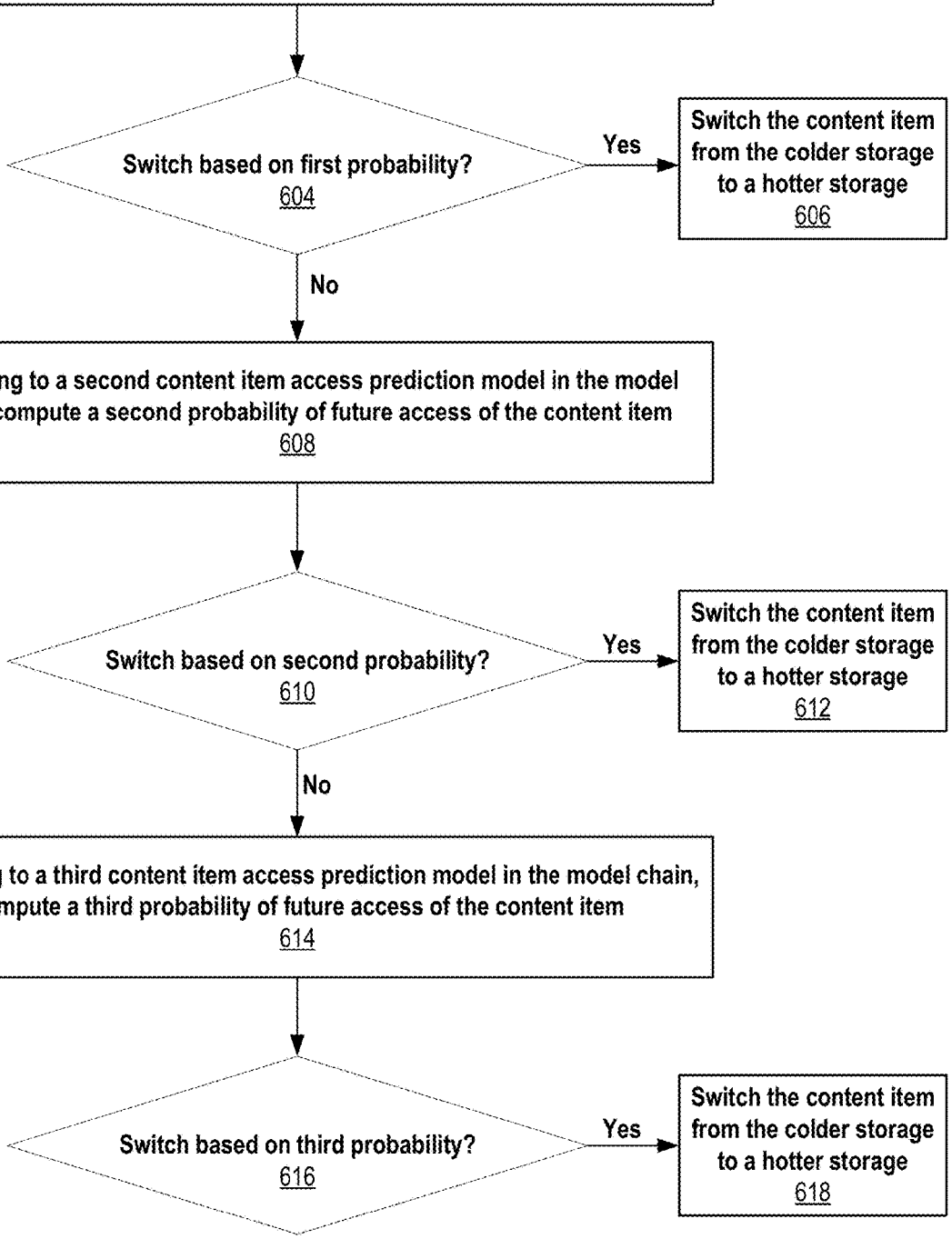
FIG. 6 illustrates an example colder storage to hotter storage access pattern prediction method, according to some embodiments.

FIG. 6 depicts example method 600 for computing whether a content item stored in a colder storage is likely to be accessed in a near future period of time (e.g., within the next few hours or days), according to some embodiments. Example method 600 is described with respect to example model chain 200 of FIG. 2. However, a like method for computing whether the content item is likely to be accessed in a near future period of time can be performed with fewer (e.g., 1 or 2) or more (four or more) models of a model chain.

At operation 602, at or approximately at reference time X 210 for the content item, a first probability is computed for a content item stored in the colder storage. The first probability is computed using model 202. The first probability is a probability that the content item will be accessed during future period of time 216 for the content item. The first probability is computed based on features of historical accesses 214 of the content item in the system prior to between initial time 208 of the content item and reference time X 210 for the content item. For example, the features of historical accesses 214 of the content item based on which the first probability is computed may include, but are not limited to, a number of read accesses (gets) of the content item in the system between initial time 208 of the content item and reference time X 210 for the content item and/or a number of update accesses (puts) of the content item in the system between initial time 208 of the content item and reference time X 210 for the content item. Other features based on which the first probability is computed may include, but are not limited to, the type (file extension) of the content item, the hour of the day of initial time 208 of the content item, and/or the size (e.g., in bytes) of the content item at initial time 208 of the content item.

While in some embodiments the accesses of historical accesses 214 of the content item from which features are extracted encompass all historical accesses 214 of the content item between initial time 208 of the content item and reference time X 210 for the content item, the accesses of historical accesses 214 of the content item from which features are extracted is a subset of all historical accesses 214 of the content item in other embodiments. For example, the subset can be a number of the most recent historical accesses 214 of the content item and/or the subset can include only accesses of a certain access type (e.g., only read accesses or only write accesses).

At operation 604, a first determination is made whether to switch the content item from the colder storage to a hotter storage. The first determination is made based on the first probability computed 502. For example, if the first probability indicates that it is more likely than not (e.g., greater than 50% probability) that the content item will be accessed during future period of time 216 for the content item, then the content item may be switched 606 from the colder storage to a hotter storage in expectation of the probable near future access. However, if the first probability indicates that it is unlikely that the content item will be accessed during future period of time 216 for the content item, then the content item may remain stored in the colder storage. The first determination may be based on comparing the first probability to a threshold probability of future access where if the first probability is greater than the threshold probability, then the content item is switched 606 from the colder storage to a hotter storage. Otherwise, the content item remains stored in the colder storage.

If it is determined 604 not to switch the content item from the colder storage to a hotter storage, then, at operation 608, at or approximately at reference time Y 218 for the content item, a second probability is computed for the content item stored in the colder storage. The second probability may be computed like the first probability at operation 602 except using model 204 and with respect to historical accesses 222 of the content item, reference time Y 218 for the content item, future period of time 224 for the content item, and horizon time 220 for the content item. Note that the second probability may take into account any historical accesses 222 of the content item that occurred after reference time X 210 for the content item and before reference time Y 218 for the content item which the first probability did not take into account. In addition, historical accesses 222 of the content item may include accesses of historical accesses 214 taken into account when computing 602 first probability using model 202.

At operation 610, a second determination is made whether to switch the content item from the colder storage to a hotter storage. The second determination may be made based on the second probability computed 608, like the first determination 604 is made based on the first probability computed 602. If it is decided based on the second probability to switch the content item, then the content item is switched 612 from the colder storage to a hotter storage. Otherwise, the content item remains stored in the colder storage.

If it is determined 610 not to switch the content item from the colder storage to a hotter storage, then, at operation 614, at or approximately at reference time Z 226 for the content item, a third probability is computed for the content item stored in the colder storage. The third probability may be computed like the first probability at operation 602 except using model 206 and with respect to historical accesses 230 of the content item, reference time Z 226 for the content item, future period of time 232 for the content item, and horizon time 228 for the content item. Note that the third probability may take into account any historical accesses 230 of the content item that occurred after reference time Y 218 for the content item and before reference time Z 226 for the content item which the second probability did not take into account. In addition, historical accesses 230 of the content item may include accesses of historical accesses 214 of the content item taken into account when computing 602 first probability using model 202 and accesses of historical accesses 222 of the content item taken into account when computing 608 second probability using model 204.

At operation 616, a third determination is made whether to switch the content item from the colder storage to a hotter storage. The third determination may be made based on the third probability computed 614, like the first determination 604 and the second determination 610 are made based on the first probability computed 602 and the second probability computed 608, respectively. If it is decided based on the third probability to switch the content item, then the content item is switched 518 from the colder storage to a hotter storage. Otherwise, the content item remains stored in the colder storage.

If it is determined 616 not to switch the content item from the colder storage to a hotter storage, then the content item can remain in the colder storage and evaluated again in the future for switching.

In some embodiments, a multi-model model chain is not used to determine whether to switch content items from a colder storage to a hotter storage. Instead, a set of content items in the colder storage are selected according to a colder-to-hotter switching candidate selection criterion and the set of content items are evaluated in bulk for possible data storage scheme switching. That is, each content item in selected set is evaluated for possible future access using a model to predict the probability of the future access. The colder-to-hotter switching candidate selection criterion can be based on various factors including, but not limited to, recency of accesses, frequency of accesses, or a combination of recently and frequency of accesses. For example, the colder-to-hotter switching candidate selection criterion may favor selection of content items in the colder storage that were accessed recently multiple times over selection of content items accessed a few times in the past.

Example Content Item Access Pattern Prediction Method

Figure 7:
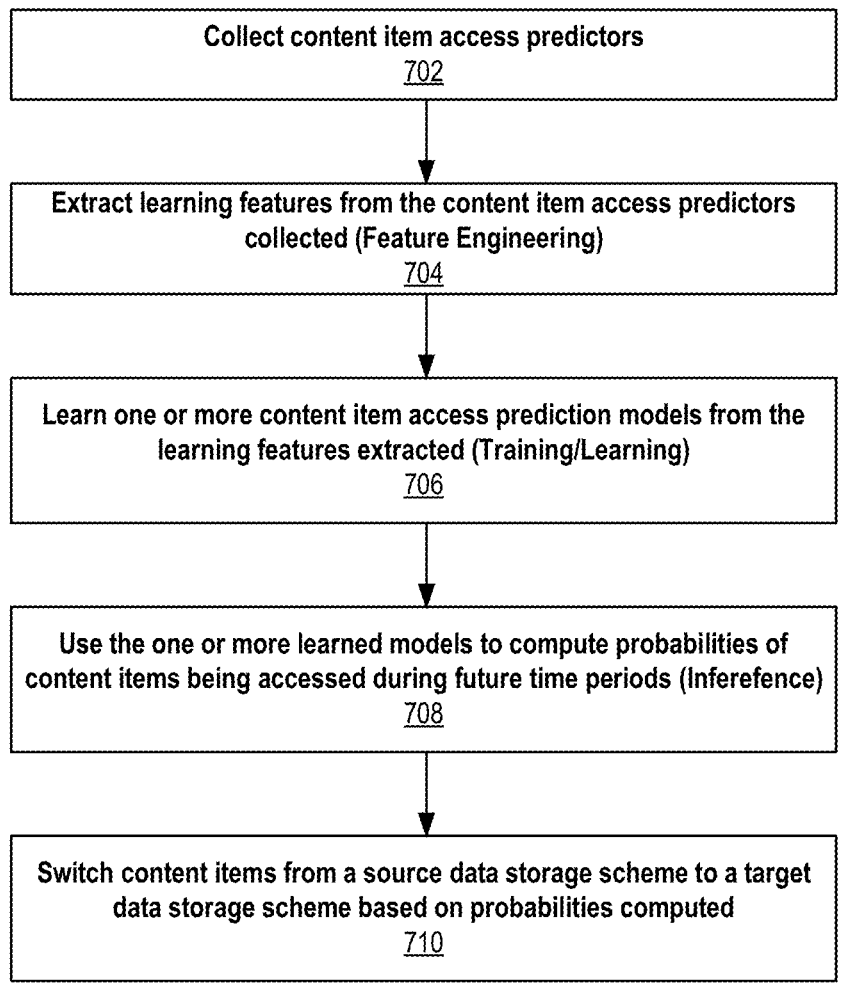
FIG. 7 illustrates an example data storage scheme switching method, according to some embodiments.

FIG. 7 illustrates overall method 700 for content item access prediction, according to some embodiments. Method 700 may be performed by one or more computing devices of a distributed data storage system to model content item access patterns in the system and to create one or more models to determine probable future content item accesses in the system and the timing of those accesses. Based on the computed probabilities, content items can be switched between different data storage schemes used by the system.

For example, method 700 may be performed to determine that a content item currently in colder storage having a higher data access cost is likely to be accessed in the near future and hence, should be switched to a hotter storage having a lower data access cost.

As another example, method 700 may be performed to determine that a content item currently in a hotter storage having a higher data storage cost is likely to not be accessed in the near future and hence, should be switched to a colder storage having a lower data storage cost.

As another example, method 700 may be performed to determine that a content item currently in a hotter storage having a lower data access cost is likely to be accessed during off-peak hours in the future and hence, should be switched to a colder storage where a higher data access cost of the colder storage (e.g., greater network bandwidth consumed on access) has less of a negative impact during the off-peak hours. For example, during off-peak hours, there may be fewer accesses of content items in the system resulting in less overall consumption of limited network bandwidth. Furthermore, the cost to use the limited network bandwidth may be less expensive during off-peak hours because of a lower cost per bit or byte transmitted on the network charged by the network provider compared to peak (regular business) hour charge.

Method 700 may be performed in the context of different distributed data storage systems. Some example distributed data storage systems are provided herein. However, no particular distributed data storage system is required for method 700, and method 700 may be performed in the context of any suitable distributed data storage system. For example, the system may be implemented by multiple computing devices housed in multiple data center facilities where computing devices within a data center are interconnected by one or more data communication networks (e.g., one or more Internet Protocol (IP)-networks) and where computing devices in different data centers are interconnected by one or more data communication networks (e.g., one or more Internet Protocol (IP)-networks). The system may utilize different types of data storage devices for storing content items.

Method 700 may be performed to determine whether to switch various content items between various data storage schemes. Such data storage schemes can include hotter and colder data storage schemes. Data storage scheme can encompass various types of data storage device, various data compression algorithms, and/or various data redundancy (replication) schemes.

Method 700 may be performed to determine whether to switch content items stored in one type of data storage device to another type of data storage device. For example, the system may utilize one or more different types of volatile memory devices and/or one or more different types of non-volatile memory devices, each with different data storage and access costs. Non-limiting examples of volatile memory device types that may be used include one or more of: dynamic random-access memory (DRAM), static random-access memory (SRAM), etc. Non-limiting examples non-volatile memory device types that may be used include one or more of: flash memory, solid state drives, ferroelectric random-access memory (FRAM), magnetoresistive random-access memory (MRAM), hard disk drives, memristor-based memory, etc.

According to some embodiments, switching a content item from a source type of data storage device to a target type of data storage device may involve the system storing the content item in the target type data storage device and the system removing (e.g., deleting) the content item as stored in the source data storage device, before, after, and/or while storing the content item in the target type of data storage device. The source type of data storage device may be different than the target type of data storage device in that one is a hotter storage and the other is a colder storage.

The distributed data storage system in which method 700 is performed may utilize one or more different data compression schemes. Method 700 may be performed to determine whether to switch a content item from a current data compression scheme to another data compression scheme. One type of data compression scheme is no data compression (other than any pre-existing data compression that was previously applied to the content item when received by the system for storage.)

According to some embodiments, the system applies one or more lossless data compression algorithms to content items stored in the system to transform the content items from a source data format to a target, losslessly compressed, data format relative to the source data format. For example, upon or after storing a content item in the system, the system may apply a lossless data compression algorithm to the content item to transform the content item to a particular lossless data compression format. The lossless data compression algorithm may be applied by the system to the content item in addition to any pre-existing data compression algorithm that was previously already applied to the content item when received for storage by the system. For example, an image content item uploaded to the system for storage may already be in a standard Joint Photographic Experts Group (JPEG) data format, or the like. The system may apply different lossless data compression algorithms having different data storage and access costs to different types of content items. In addition to well-known lossless data compression algorithms, some non-limiting examples of lossless data compression algorithms that may be applied by the system to different types of content items are described in the following patent documents, the entire contents of each of which is hereby incorporated by reference as if fully set forth herein: (1) U.S. Pat. No. 9,941,900 to Horn and others, "Techniques for General-Purpose Lossless Data Compression Using a Recurrent Neural Network," filed Oct. 3, 2017; (2) U.S. Pat. No. 10,177,783, to Horn and others, "Lossless compression of a content item using a neural network trained on content item cohorts," filed Apr. 6, 2018; and (3) U.S. Pat. No. 9,712,830 to Horn and others, "Techniques for Image Recompression," filed Sep. 30, 2016. In some embodiments, the pre-existing data compression applied to a content item is removed and replaced with a lossless data compression format that further compresses the content item. For example, the technique described in U.S. Pat. No. 9,712,830 may be used to remove the entropy encoding of baseline JPEG encoding content items and replace it with an arithmetic entropy encoding technique that further compressed the JPEG content items beyond their baseline JPEG compression level.

According to some embodiments, switching a content item from a source type of data compression (or no data compression other than any pre-existing data compression) to a target type of data compression (or no data compression other than any pre-existing data compression) may involve the system storing the content item with the target type of data compression applied to the content item (or no data compression applied to the content item other than any pre-existing data compression that was applied to the content item) and the system removing (e.g., deleting) the content item with the source type of data compression applied (or no data compression applied other than any pre-existing data compression), before, after, and/or while storing the content item with the target type of data compression applied (or no data compression other than any pre-existing data compression). The source type of data compression (or no data compression other than any pre-existing data compression) may be different than the target type of data compression (or no data compression other than any pre-existing data compression) in that one is a hotter storage and the other is a colder storage.

The distributed data storage system in which method 700 is performed may utilize one or more different data redundancy schemes. Method 700 may be performed to determine whether to switch a content item from a current data redundancy scheme to another data redundancy scheme. Some non-limiting examples of different data redundancy schemes include 3-times replication (e.g., creating three copies of a content item on three separate data storage devices), a standard redundant array of inexpensive disks (RAID) level (e.g., RAID 0, RAID 1, RAID 2, RAID 3, RAID 4, RAID 5, RAID 6, etc.), and erasure-coding schemes (e.g., Reed-Solomon erasure coding). One data redundancy scheme that the system may use is described in the following patent document, the entire contents of which is hereby incorporated by reference as if fully set forth herein: U.S. Pat. No. 9,619,322 to Cowling and others, "Erasure-Coding Extents in an Append-Only Storage System," filed Nov. 13, 2014. Another data redundancy scheme that the system may use is described in greater detail below in the context of a data storage scheme switching example.

According to some embodiments, switching a content item from a source data redundancy scheme (e.g., 3-times replication) to a target data redundancy scheme (e.g., erasure-coding) may involve the system storing the content item according to the target data redundancy scheme and the system removing (e.g., deleting) the content item stored according to the source data redundancy scheme, before, after, and/or while storing the content item according to the target data redundancy scheme. The source type of data redundancy scheme may be different than the target type of data redundancy scheme in that one is a hotter storage and the other is a colder storage.

According to some embodiments, reference herein to "deleting" or "removing" data from the system may encompass marking or otherwise updating in-memory or on-disk data structures to indicate that data storage space occupied by the data is free to be used for storing other data and, unless the context indicates otherwise, is not intended to mean that the data is necessarily made practically unrecoverable by the delete or remove operation. However, "deleting" or "removing" data from the system may encompass making the data practically unrecoverable.

According to some embodiments, when a content item is switched from a colder storage to a hotter storage, the storage space occupied by the content item in the colder storage is not freed. For example, the colder storage may have practically infinite storage capacity such that the colder data storage system is expanded with new data storage devices as needed to increase storage capacity.

According to some embodiments, when a content item is switched from a hotter storage to a colder storage, the storage space occupied by the content item in the hotter storage is freed to make room for storing other content items in the hotter storage.

While in some embodiments switching a content item from a source data storage scheme to a target data storage scheme involves storing the content item according to the target data storage scheme and before, after, and/or while doing so, removing the content item stored according to the source data storage scheme, switching a content item from a source data storage scheme to a target data storage scheme involves moving or migrating the content item from the source data storage scheme to the target data storage scheme in other embodiments. For example, switching a content item from a source data storage scheme to a target data storage scheme may involve moving data blocks that make up the content item from the source data storage scheme to the target data storage scheme.

Returning now to FIG. 7, example method 700 involves collecting content item access predictors 702 based on content item accesses in the system. Features are extracted 704 from the predictors collected 702. One or more access prediction models are learned 706 from the features extracted 704. The one or more learned 706 models are used 708 to compute probabilities that content items stored in the system will be accessed during future time periods. In some embodiments, content items are switched 710 from a source data storage scheme to a target data storage scheme based on the computed probabilities.

Example Content Item Access Predictors

When a content item is stored and accessed in the system, various metadata about the content item and the accesses may be also be stored by the system (e.g., in computer databases, log files, etc.). Such metadata may be useful predictors for when a content item will be accessed next. For example, some useful predictors for a content item may include, but are not limited to, recency (e.g., a time of a most recent access of the content item), frequency (e.g., based on a number of accesses of the content item during a period of time), and the size (e.g., in bytes) of the content item.

Figure 8:
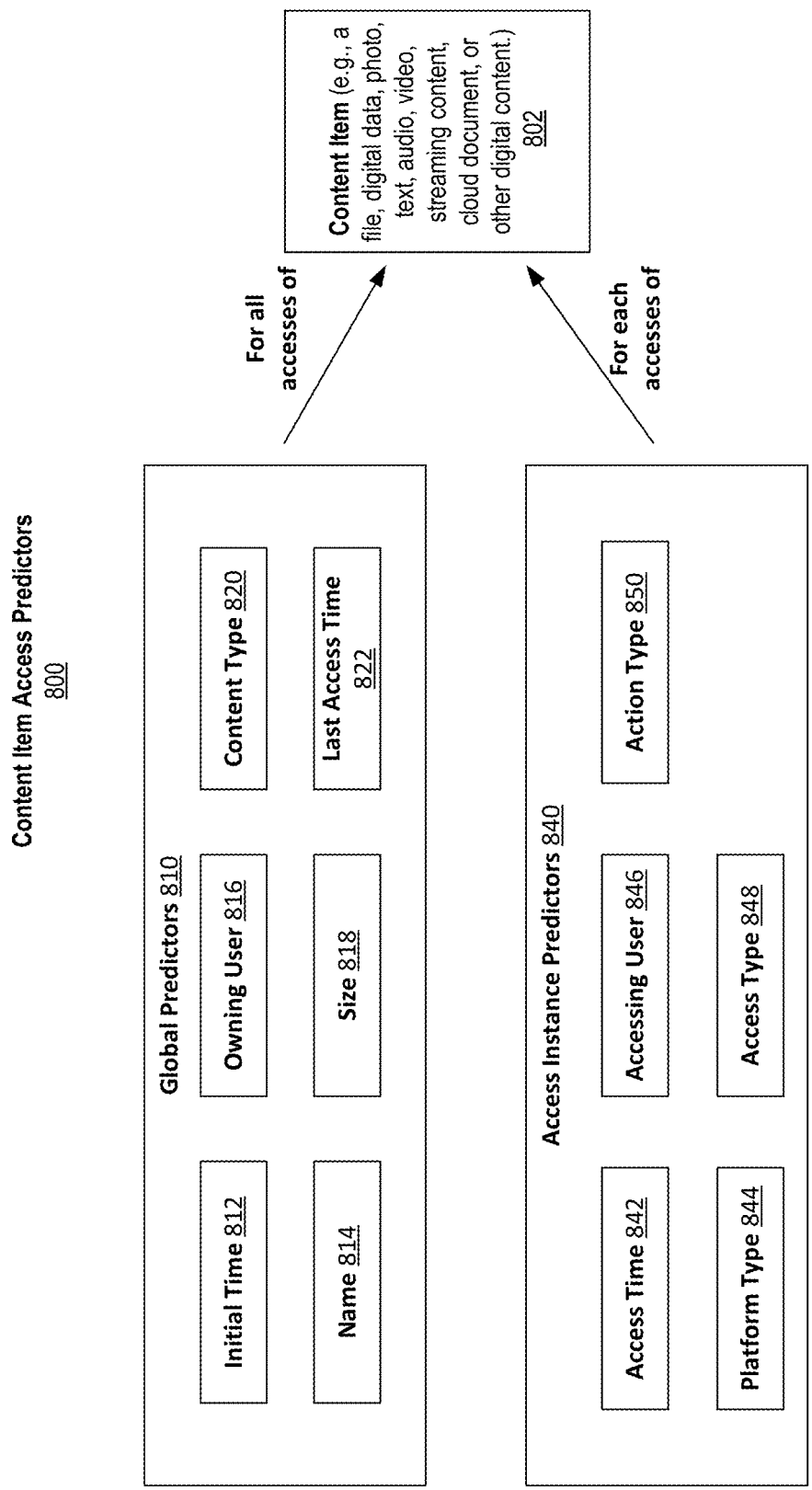
FIG. 8 depicts an example set of content item access pattern predictors, according to some embodiments.

FIG. 8 depicts some example content item access predictors 800 for content item 802 that may be collected 102 by the system for content item 802, in some embodiments. All of these predictors 800 may be collected 702 by the system for content item 802, a subset of predictors 800 may be collected 702 by the system for content item 802, or a superset thereof may be collected 702 by the system for content item 802.

Collection 702 of a predictor for content item 802 may involve storing data representing the predictor in a database which may index the predictors in various ways for efficient access and querying. While just one content item is depicted in FIG. 8, the system may likewise collect 702 predictors for many content items (e.g., thousands, millions, billions, or more content items). Thus, content item 802 of FIG. 8 should be viewed as generically representing any content item in the system.

In some embodiments, predictors 800 for content item 802 are broken down into global predictors 810 for content item 802 and access instance predictors 840 for content item 802. Global predictors 810 are attributes of content item 802 that are pertinent to all access instances of content item 802. Access instance predictors 840 are attributes of a particular instance in which content item 802 is accessed in the system. Multiple sets of access instance predictors 840 may be stored in system for content item 802, one set for each of multiple access instances.

Content item 802 generically represents any content item stored in the system. For example, content item 802 can be a file, digital data, photo, text, audio, video, streaming content, cloud document, or other digital content stored in the system. In some embodiments, content item 802 can be shared with and collaborated on by multiple users. Different types of content items may be stored in the system as there is no requirement that all content items stored in the system be a same type or otherwise all share a same characteristic. Content item 802 may be stored in various different forms in system including as a file in a filesystem or as one or more data blocks or otherwise in one or more pieces or portions that are, for example, replicated or erasure coded. An example distributed data storage system storing content items as data blocks appended to extents is described in the following patent document, the entire contents of which is hereby incorporated by reference as if fully set forth herein: U.S. Pat. No. 9,720,607 to Cowling and others, "Append-Only Storage System Supporting Open and Closed Extents," filed Sep. 25, 2014.

In some embodiments, global predictors 810 for content item 802 include initial time 812, name 814, owning user 816, size 818, content type 820, and last access time 822. Initial time 812 may be data that represents a date and time at which content item 802 is initially stored in the system or a date and time at which content item 802 is switched from one data storage scheme to another. For example, initial time 812 may reflect approximately when any of the following events occur:

- an end-user of the system uploads content item 802 to the system for storage in the system,
- content item 802 is initially stored in the system,
- content item 802 is replicated in the system,
- content item 802 is erasure-coded in the system,
- content item 802 is edited, modified, or updated in the system,
- a content management system takes a content management action on content item 802, or
- content item 802 is switched from one data storage scheme to another data storage scheme.

Name 814 may be data that represents a given name for content item 802. For example, name 814 may reflect a filename, file path, title, and/or other name or moniker given to content item 802.

Owning user 816 may be data that identifies an end-user of the system that is considered to be the owner of content item 802. For example, owning user 816 may reflect an end-user that uploaded content item 802 to the system for storage in the system, or an end-user that currently owns content item 802.

Size 818 may be data that represents the size of content item 802 in number of bytes, for example. For example, size 818 may reflect the initial size of content item 802 in bytes when uploaded to the system for storage in the system or reflect a current size of content item 802.

Content type 820 may be data that represents a content type of content item 802. For example, content type 820 may reflect a file extension or a Multipurpose Internet Mail Extensions (MIME) type or Internet Assigned Numbers Authority (IANA) type associated with content item 802.

Last access time 822 may be data that represents a date and time at which content item 802 was last accessed in the system. For example, last access time 822 may reflect approximately when content item 802 was last created, read, updated, or deleted in the system.

In some embodiments, a read of content item 802 may encompass reading all of content item 802 (e.g., reading all data block(s) stored in the system that make up the content item) or reading only a portion of content item 802 (e.g., reading a subset of all data blocks that make up content item 802 as stored in the system).

In some embodiments, an update to content item 802 may encompass updating all of content item 802 (e.g., updating all data block(s) stored in the system that make up the content item), updating only a portion of content item 802 (e.g., updating a subset of all data blocks that make up content item 802 as stored in the system), adding to content item 802 (e.g., storing one or more new data blocks in the system that make up a new portion of content item 802), and/or removing from content item 802 (e.g., removing some but not all data blocks in the system that make up content item 210).

In some embodiments, a delete of content item 802 may encompass deleting all of content item 802 from system (e.g., delete all data block(s) stored in that system that make up content item 802).

In some embodiments, access instance predictors 840 for content item 802 include access time 842, platform type 844, accessing user 846, access type 848, and action type 850. The system may store a set of access instance predictors 840 for each of multiple accesses of content item 802 in the system. Thus, access instance predictors 840 represents a respective one of potentially many accesses of content item 802 in the system.

Access time 842 may be data that represents a date and time at which content item 802 is accessed (created, read, updated, or deleted) in the system. For example, access time 842 may reflect approximately when an end-user of the system took an end-user action (e.g., approximately when end-user viewed, downloaded, edited, etc. the content item 802) that caused content item 802 to be accessed in the system at access time 842.

Platform type 844 may be data that represents a type of end-user computing platform used by the end-user that took the end-user action that caused content item 802 to be accessed in the system at access time 842. For example, platform type 844 may reflect whether the end-user took the end-user action using a mobile application ("mobile app"), a dedicated desktop client application ("desktop app"), or an industry-standard web browser ("web browser").

Accessing user 846 may be data that identifies the end-user that took the end-user action, which may be the same end-user or a different end-user than owning user 816.

Access type 848 may be data that identifies the access operation applied to content item 802 in the system. For example, access type 848 may reflect whether the access operation was a create, read, update, or delete operation.

Action type 850 may be data that identifies the end-user action that the end-user took that causes content item 802 to be accessed by access type 848 at access time 842. For example, action type 850 may reflect whether the end-user downloaded, viewed, or edited content item 802.

It should be understood that predictors 800 are not intended to be exclusive of other content item access predictors that may be collected 702 and from which features may be extracted 704.

Feature Extraction

Figure 9:
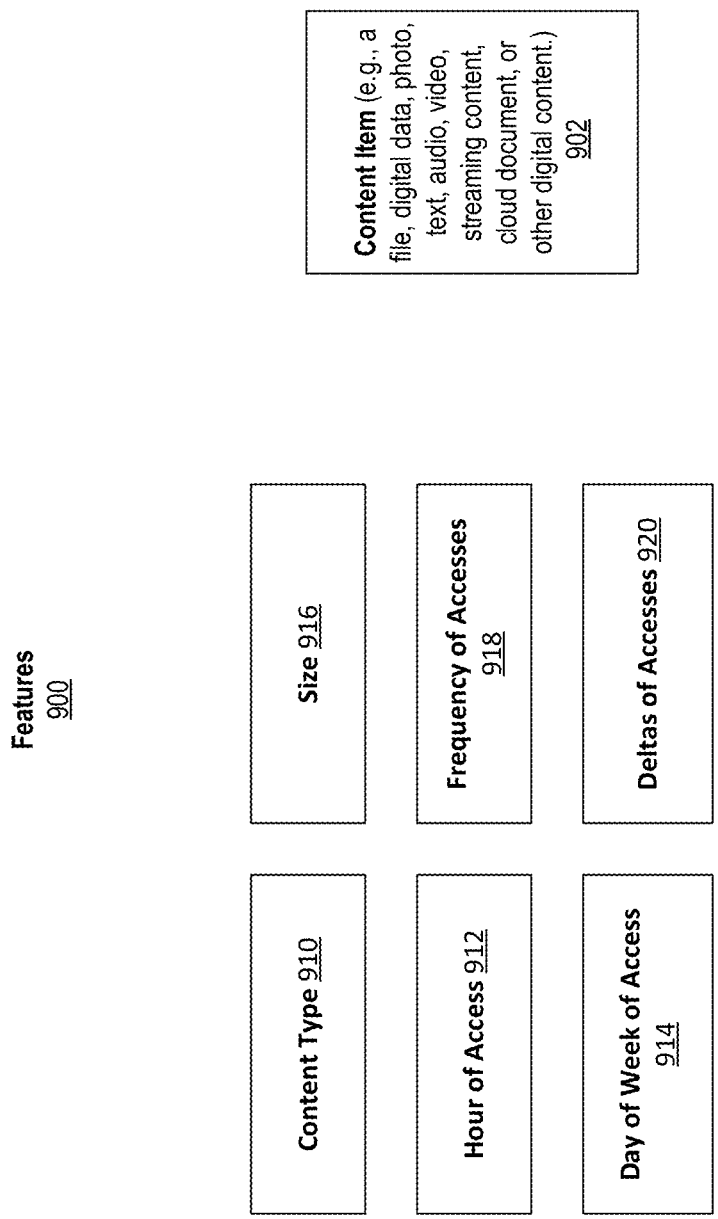
FIG. 9 depicts an example set of machine learning features for content item access pattern prediction, according to some embodiments.

Returning to method 700 of FIG. 7, one or more models are learned 706 from learning features extracted 704 from predictors collected 702. FIG. 9 depicts some example features 900 for content item 902 (like content item 802) that may be extracted 704 by the system from predictors 800 collected for content item 902, in some embodiments. All of these features 900 may be extracted 704 by the system for content item 902, a subset of features 900 may be extracted 704 by the system for content item 902, or a superset thereof may be extracted 704 by the system for content item 902.

Extraction 704 of features 900 for content item 902 may involve processing predictors 800 collected 702 for content item 902 and storing data representing features 900 in database(s), file(s), or other suitable data container(s). While just one content item is depicted in FIG. 9, the system may likewise extract 704 features for many content items (e.g., thousands, millions, billions, or more content items). Thus, content item 902 of FIG. 9 should be viewed as generically representing any content item in the system.

In some embodiments, the data representing features 900 for content item 902 may be a vector or vectors and/or a matrix or matrices of real numbers that are generated as a result of transformations (e.g., feature engineering) applied to predictors 800 collected 702 for content item 800 and/or data derived from predictors 800. Such transformations may be performed as part of feature extraction 704, when learning 706 a model from features 900, and/or when using 708 a learned 706 model with features 900 as input to compute a probability of content item 902 being accessed during a future time period. Such transformations may include converting non-numeric or alpha-numeric data (e.g., string data) to numeric data, resizing variable sized data to a fixed size, tokenizing or lower-casing text data, normalizing numeric data, etc. Normalizing numeric data may include transforming numeric data to the same scale as other numeric data and/or transforming continuous numeric data to categorical data, etc. Transforming numeric data to the same scale as other numeric data may include applying linear scaling, clipping, log scaling, or Z-score normalization techniques to the numeric data. Transforming continuous numeric data to categorical data may include bucketing numerical data. Bucketing numerical data may include bucketing the numerical data in buckets with equally spaced boundaries or in buckets with quantile boundaries, for example. Categorical data (e.g., the days of the week, the hours of a day, a set of content types, a set of access types, a set of action types, etc.) may be transformed by a vocabulary, by hashing, or as an embedding (e.g., a mapping of a discrete categorical variable to a finite vector of continuous numbers).

Transformation of predictors 800 for content item 902 to real number representations of features 900 for content item 902 can be performed for all or some features 900 by the system before learning 706 a model from features 900, performed for all or some features 900 by the system while learning 706 a model from features 900, performed for all or some features 900 before using 708 a learned 706 model with features 900 as input to compute a probability of content item 902 being access during a future time period, and/or performed for all or some features 900 while using 708 a learned 706 model with features 900 as input to compute a probability of content item 902 being accessed during a future time period. Thus, content item 902 represents both a content item for which features 900 are used as a training example while learning 706 a model (e.g., during training) and a content item (e.g., a new or unseen content item) for which a probability of being accessed during a future time period is computed using 708 features 900 as input to a learned 706 model to compute the probability (e.g., during inference).

Features 900 of content item 902 include content type features 900, hour of access features 912, day of week of access features 914, size features 916, frequency of access features 918, deltas of access features 920, and name features 922, among other possible features.

Content type features 910 can be useful during learning 706 and inference 708 to numerically capture relationships between different content types, content item access patterns, and other features 900. In some embodiments, content type features 910 of content item 902 include a numerical representation of a file extension, a Multipurpose Internet Mail Extensions (MIME) type, or Internet Assigned Numbers Authority (IANA) type associated with content item 902. In some embodiments, the numerical representation is a content type embedding as described in the following patent application, the entire contents of which is hereby incorporated by reference as is fully set forth herein: U.S. patent application Ser. No. 16/675,671 by Baek and others, "Content Type Embeddings," filed Nov. 16, 2019.

Hour of access features 912 can be useful during learning 706 and inference 708 to numerically capture relationships between content item accesses at different hours of the day, content item access patterns, and other features 900. For example, hour of access features 912 can reflect whether content items are accessed during on-peak or off-peak hours.

With reference to general model 100, during training 706 or inference 708, hour of access features 912 for content item 902 may encompass (be based on) one or more of the following, or a superset thereof:
- an hour of the day (e.g., 0-23 hours) of initial time 102 of content item 902,
- an hour of the day of each of one or more of historical accesses 108 of content item 902,
- a number of times content item 902 is accessed between initial time 102 of content item 902 and reference time 104 of content item 902 during certain hour or hours of the day,
- a number of times content item 902 is accessed between initial time 102 of content item 902 and reference time 104 of content item 902 during on-peak hours of the day, or
- a number of times content item 902 is accessed between initial time 102 of content item 902 and reference time 104 of content item 902 during off-peak hours of the day.

Day of week features 914 can be useful during learning 706 and inference 708 to numerically capture relationships between content item accesses on different days of the week, content item access patterns, and other features 900. For example, day of week features 914 can reflect whether content items are accessed on the weekends or on weekdays.

With reference to general model 100, during training 706 or inference 708, hour of access features 912 for content item 902 may encompass (be based on) one or more of the following, or a superset thereof:
- a day of the week (e.g., 0-6 days) of initial time 102 of content item 902,
- a day of the week of each of one or more of historical accesses 108 of content item 902,
- a number of times content item 902 is accessed between initial time 102 of content item 902 and reference time 104 of content item 902 on certain day or days of the week,
- a number of times content item 902 is accessed between initial time 102 of content item 902 and reference time 104 of content item 902 on weekend days, or
- a number of times content item 902 is accessed between initial time 102 of content item 902 and reference time 104 of content item 902 on weekdays.

Size features 916 can be useful during learning 706 and inference 708 to numerically capture relationships between different content item sizes, content item access patterns, and other features 900.

With reference to general model 100, during training 706 or inference 708, size features 916 for content item 902 may encompass (be based on) on one or more of the following, or a superset thereof:
- a size of content item 902 at initial time 102 of content item,
- a size of content item 902 at reference time 104 of content item.

Frequency of access features 918 can be useful during learning 706 and inference 708 to numerically capture relationships between different content item access patterns and other features 900.

With reference to general model 100, during training 706 or inference 708, frequency of access features 918 for content item 902 may encompass (be based on) one or more of the following, or a superset thereof:
- a total number of historical accesses 108 of content item 902,
- a number of historical accesses 108 of content item 902 that are read (get) accesses,
- a number of historical accesses 108 of content item 902 that are update (put) accesses,
- a number of historical accesses 108 of content item 902 that are caused by an action type 850 in a predetermined set of one or more action types 850,
- a number of historical accesses 108 of content item 902 that are associated with an accessing user 846 in a predetermined set of one or more accessing users 846, or
- a number of historical accesses 108 of content item 902 that are associated with a platform type 844 in a predetermined set of one or more platform types 844.

Deltas of accesses features 920 can be useful during learning 706 and inference 708 to numerically capture relationships between different content item access patterns and other features 900.

With reference to general model 100, during training 706 or inference 708, deltas of access features 920 for content item 902 may encompass (be based on) one or more of the following, or a superset thereof:
- a time delta (difference) between initial time 102 of content item 902 and a first in time access (e.g., a first read, a first update, or a first access) of historical accesses 108 of content item 902,
- a time delta (difference) between initial time 102 of content item 902 and a last in time access (e.g., a last read, a last update, or a last access) of historical accesses 108 of content item 902, a time delta (difference) between reference time 104 of content item 902 and a first in time access of historical accesses 108 of content item 902, or a time delta (difference) between reference time 104 of content item 902 and a last in time access of historical accesses 108 of content item 902.

Name features 922 can be useful during learning 706 and inference 708 to numerically capture relationships between content item names 814, content item access patterns, and other features 900. In some embodiments, a name feature 922 is represented by an embedding (a vector of real numbers). For example, a name feature 922 for a content item may be generated based on a file name or a file path for the content item in a centrally-hosted network file system or in a content management system (e.g., FIG. 10).

At operation 706, a machine learning model is learned (trained) based on a set of training examples. The model may be learned in a batch or incremental (online) fashion. For example, a model for use in any methods 300, 400, 500, or 600 may be learned 706. Operation 706 may be repeated for multiple models such as, for example, for inclusion in a model chain.

At operation 708, a learned model is used as in method 300, 400, 500, or 600 to compute probabilities of content items being accessed during future time periods.

At operation 710, content items may be switched between different data storage schemes as described above in method 300, 400, 500, or 600. In some embodiments, if a content item currently in a hotter storage should be switched according to off-peak only access prediction method 300, then the content item is switched to a colder storage regardless if the content item should or should not be switched according to hotter-to-colder access prediction method 500. In these embodiments, evaluation of the content item according to hotter-to-colder access prediction method 500 may be performed on the content item if the content item should not be switched to a colder storage according to off-peak only access prediction method 300. However, if the content item should be switched to a colder storage according to off-peak only access prediction method 300, then evaluation of the content item according to hotter-to-colder access prediction method 500 may be skipped.

Example Content Management System

Figure 10:
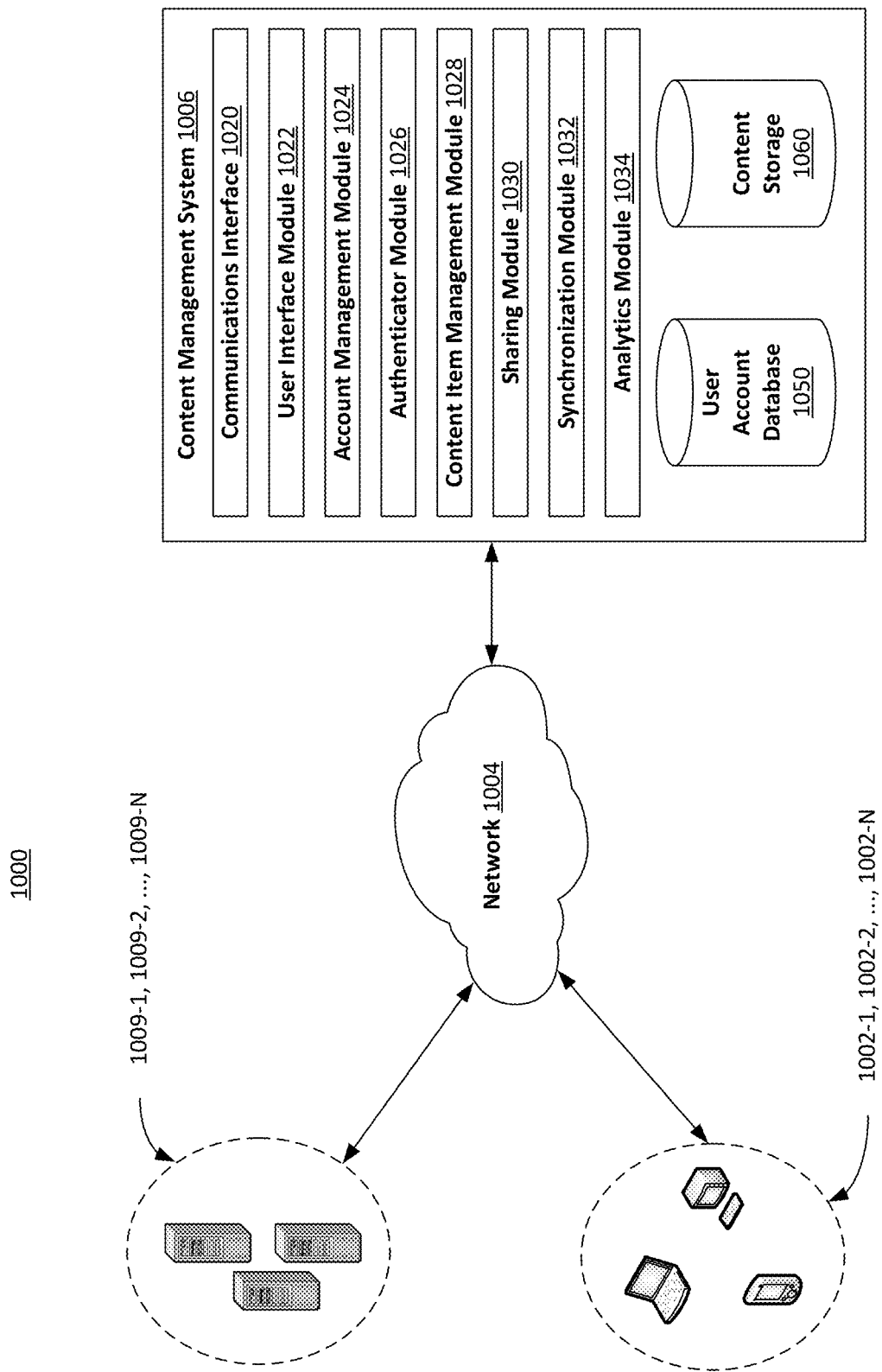
FIG. 10 illustrates an example content management system in the context of which a data storage scheme switching method is performed, in some embodiments.

With respect to implementing various embodiments of the disclosed technology, an example system configuration 1000 is shown in FIG. 10, wherein electronic devices communicate via a network for purposes of exchanging content and other data. The system can be configured for use on a wide area network such as that illustrated in FIG. 10. However, the present principles are applicable to a wide variety of network configurations that facilitate the intercommunication of electronic devices. For example, each of the components of system 1100 in FIG. 10 can be implemented in a localized or distributed fashion in a network.

In system 1000, an end-user can interact with content management system 1006 (e.g., an online synchronized content management system) through client devices 1002-1, 1002-2 . . . , 1002-N (collectively "1002") connected to network 1004 by direct and/or indirect communication. Content management system 1006 can include a single computing device (e.g., a server) or multiple computing devices (e.g., multiple servers) that are configured to perform the functions and/or operations necessary to provide the services described herein.

Content management system 1006 can support connections from a variety of different client devices, such as: desktop computers; mobile computers; mobile communications devices, e.g. mobile phones, smart phones, tablets; smart televisions; set-top boxes; and/or any other network enabled computing devices.

Client devices 1002 can be of varying type, capabilities, operating systems, etc. Furthermore, content management system 1006 can concurrently accept connections from and interact with multiple client devices 1002.

An end-user can interact with content management system 1006 via a client-side application installed on client device 1002-X. In some embodiments, the client-side application can include a content management system specific component. For example, the component can be a stand-alone application, one or more application plug-ins, and/or a browser extension. However, the end-user can also interact with content management system 1006 via a third-party application, such as a web browser, that resides on client device 1002-X and is configured to communicate with content management system 1006. In either case, the client-side application can present a user interface (UI) for the end-user to interact with content management system 1006. For example, the end-user can interact with the content management system 1006 via a client-side application integrated with the file system or via a webpage displayed using a web browser application.

Content management system 1006 can enable an end-user to store content items, as well as perform a variety of content management tasks, such as retrieve, modify, browse, and/or share the content items. Furthermore, content management system 1006 can enable an end-user to access the content from multiple client devices 1002. For example, client device 1002-X can upload content to content management system 1006 via network 1004. Later, the same client device 1002-X or some other client device 1002-Y can retrieve the content from content management system 1006.

To facilitate the various content management services, an end-user can create an account with content management system 1006. User account database 1050 can maintain the account information. User account database 1050 can store profile information for registered users. In some cases, the only personal information in the user profile can be a username and/or email address. However, content management system 1006 can also be configured to accept additional user information such as birthday, address, billing information, etc.

User account database 1050 can include account management information, such as account type (e.g. free or paid), usage information, (e.g. file edit history), maximum storage space authorized, storage space used, content storage locations, security settings, personal configuration settings, content sharing data, etc. Account management module 1024 can be configured to update and/or obtain user account details in user account database 1050. The account management module 1024 can be configured to interact with any number of other modules in content management system 1006.

An account can be used to store content items, such as digital data, documents, text files, audio files, video files, etc., from one or more client devices 1002 authorized on the account. The content items can also include collections for grouping content items together with different behaviors, such as folders, playlists, albums, etc. For example, an account can include a public folder that is accessible to any user. The public folder can be assigned a web-accessible address. A link to the web-accessible address can be used to access the contents of the public folder. In another example, an account can include: a photos collection that is intended for photos and that provides specific attributes and actions tailored for photos; an audio collection that provides the ability to play back audio files and perform other audio related actions; or other special purpose collection. An account can also include shared collections or group collections that are linked with and available to multiple user accounts. The permissions for multiple users may be different for a shared collection.

The content items can be stored in content storage 1060. Content storage 1060 can be a storage device, multiple storage devices, or a server. Alternatively, content storage 1060 can be a cloud storage provider or network storage accessible via one or more communications networks. Content management system 1006 can hide the complexity and details from client devices 1002 so that client devices 1002 do not need to know exactly where or how the content items are being stored by content management system 1006. In some embodiments, content management system 1006 can store the content items in the same collection hierarchy as they appear on client device 1002-X. However, content management system 1006 can store the content items in its own order, arrangement, or hierarchy. Content management system 1006 can store the content items in a network accessible storage (NAS) device, in a redundant array of independent disks (RAID), etc. Content storage 1060 can store content items using one or more partition types, such as FAT, FAT32, NTFS, EXT2, EXT3, EXT4, HFS/HFS+, BTRFS, and so forth.

Content storage 1060 can also store metadata describing content items, content item types, and the relationship of content items to various accounts, collections, or groups. The metadata for a content item can be stored as part of the content item or can be stored separately. In one variation, each content item stored in content storage 1060 can be assigned a system-wide unique identifier.

Content storage 1060 can decrease the amount of storage space required by identifying duplicate content items or duplicate segments of content items. Instead of storing multiple copies, content storage 1060 can store a single copy and then use a pointer or other mechanism to link the duplicates to the single copy. Similarly, content storage 1060 can store content items more efficiently, as well as provide the ability to undo operations, by using a content item version control that tracks changes to content items, different versions of content items (including diverging version trees), and a change history. The change history can include a set of changes that, when applied to the original content item version, produce the changed content item version.

Content management system 1006 can be configured to support automatic synchronization of content items from one or more client devices 1002. The synchronization can be platform agnostic. That is, the content items can be synchronized across multiple client devices 1002 of varying type, capabilities, operating systems, etc. For example, client device 1002-X can include client software, which synchronizes, via a synchronization module 1032 at content management system 1006, content in client device 1002-X's file system with the content in an associated user account. In some cases, the client software can synchronize any changes to content in a designated collection and its sub-collections, such as new, deleted, modified, copied, or moved content items or collections. The client software can be a separate software application, can integrate with an existing content management application in the operating system, or some combination thereof. In one example of client software that integrates with an existing content management application, an end-user can manipulate content items directly in a local collection, while a background process monitors the local collection for changes and synchronizes those changes to content management system 1006. Conversely, the background process can identify content items that have been updated at content management system 1006 and synchronize those changes to the local collection. The client software can provide notifications of synchronization operations, and can provide indications of content statuses directly within the content management application. Sometimes client device 1002-X may not have a network connection available. In this scenario, the client software can monitor the linked collection for content item changes and queue those changes for later synchronization to content management system 1006 when a network connection is available. Similarly, an end-user can manually start, stop, pause, or resume synchronization with content management system 1006.

An end-user can view or manipulate content via a web interface generated and served by user interface module 1022. For example, the end-user can navigate in a web browser to a web address provided by content management system 1006. Changes or updates to content in the content storage 1060 made through the web interface, such as uploading a new version of a content item, can be propagated back to other client devices 1002 associated with the end-user's account. For example, multiple client devices 1002, each with their own client software, can be associated with a single account and content items in the account can be synchronized between each of the multiple client devices 1002.

Content management system 1006 can include a communications interface 1020 for interfacing with various client devices 1002, and can interact with other content and/or service providers 1009-1, 1009-2, . . . , 1009-N (collectively "1009") via an Application Program Interface (API). Certain software applications can access content storage 1060 via an API on behalf of an end-user. For example, a software package, such as an app running on a smartphone or tablet computing device, can programmatically make calls directly to content management system 1006, when an end-user provides credentials, to read, write, create, delete, share, or otherwise manipulate content. Similarly, the API can allow users to access all or part of content storage 1060 through a web site.

Content management system 1006 can also include authenticator module 1026, which can verify user credentials, security tokens, API calls, specific client devices, and so forth, to ensure only authorized clients and users can access content items. Further, content management system 1006 can include analytics module 1034 module that can track and report on aggregate file operations, user actions, network usage, total storage space used, as well as other technology, usage, or business metrics. A privacy and/or security policy can prevent unauthorized access to user data stored with content management system 1006.

Content management system 1006 can include sharing module 1030 for managing sharing content publicly or privately. Sharing content publicly can include making the content item accessible from any computing device in network communication with content management system 1006. Sharing content privately can include linking a content item in content storage 1060 with two or more user accounts so that each user account has access to the content item. The sharing can be performed in a platform agnostic manner. That is, the content can be shared across multiple client devices 1002 of varying type, capabilities, operating systems, etc. The content can also be shared across varying types of user accounts.

In some embodiments, content management system 1006 can be configured to maintain a content directory identifying the location of each content item in content storage 1060. The content directory can include a unique content entry for each content item stored in the content storage.

A content entry can include a content path that can be used to identify the location of the content item in a content management system. For example, the content path can include the name of the content item and a folder hierarchy associated with the content item. For example, the content path can include a folder or path of folders in which the content item is placed as well as the name of the content item. Content management system 1006 can use the content path to present the content items in the appropriate folder hierarchy.

A content entry can also include a content pointer that identifies the location of the content item in content storage 1060. For example, the content pointer can include the exact storage address of the content item in memory. In some embodiments, the content pointer can point to multiple locations, each of which contains a portion of the content item.

In addition to a content path and content pointer, a content entry can also include a user account identifier that identifies the user account that has access to the content item. In some embodiments, multiple user account identifiers can be associated with a single content entry indicating that the content item has shared access by the multiple user accounts.

To share a content item privately, sharing module 1030 can be configured to add a user account identifier to the content entry associated with the content item, thus granting the added user account access to the content item. Sharing module 1030 can also be configured to remove user account identifiers from a content entry to restrict a user account's access to the content item.

To share content publicly, sharing module 1030 can be configured to generate a custom network address, such as a uniform resource locator (URL), which allows any web browser to access the content in content management system 1006 without any authentication. To accomplish this, sharing module 1030 can be configured to include content identification data in the generated URL, which can later be used to properly identify and return the requested content item. For example, sharing module 1030 can be configured to include the user account identifier and the content path in the generated URL. Upon selection of the URL, the content identification data included in the URL can be transmitted to content management system 1006 which can use the received content identification data to identify the appropriate content entry and return the content item associated with the content entry.

In addition to generating the URL, sharing module 1030 can also be configured to record that a URL to the content item has been created. In some embodiments, the content entry associated with a content item can include a URL flag indicating whether a URL to the content item has been created. For example, the URL flag can be a Boolean value initially set to 0 or false to indicate that a URL to the content item has not been created. Sharing module 1030 can be configured to change the value of the flag to 1 or true after generating a URL to the content item.

In some embodiments, sharing module 1030 can also be configured to deactivate a generated URL. For example, each content entry can also include a URL active flag indicating whether the content should be returned in response to a request from the generated URL. For example, sharing module 1030 can be configured to only return a content item requested by a generated link if the URL active flag is set to 1 or true. Thus, access to a content item for which a URL has been generated can be easily restricted by changing the value of the URL active flag. This allows an end-user to restrict access to the shared content item without having to move the content item or delete the generated URL. Likewise, sharing module 1030 can reactivate the URL by again changing the value of the URL active flag to 1 or true. An end-user can thus easily restore access to the content item without the need to generate a new URL.

While content management system 1006 is presented with specific components, it should be understood by one skilled in the art, that the architectural configuration of system 1006 is simply one possible configuration and that other configurations with more or fewer components are possible.

Hosting Facility Infrastructure

Figure 11:
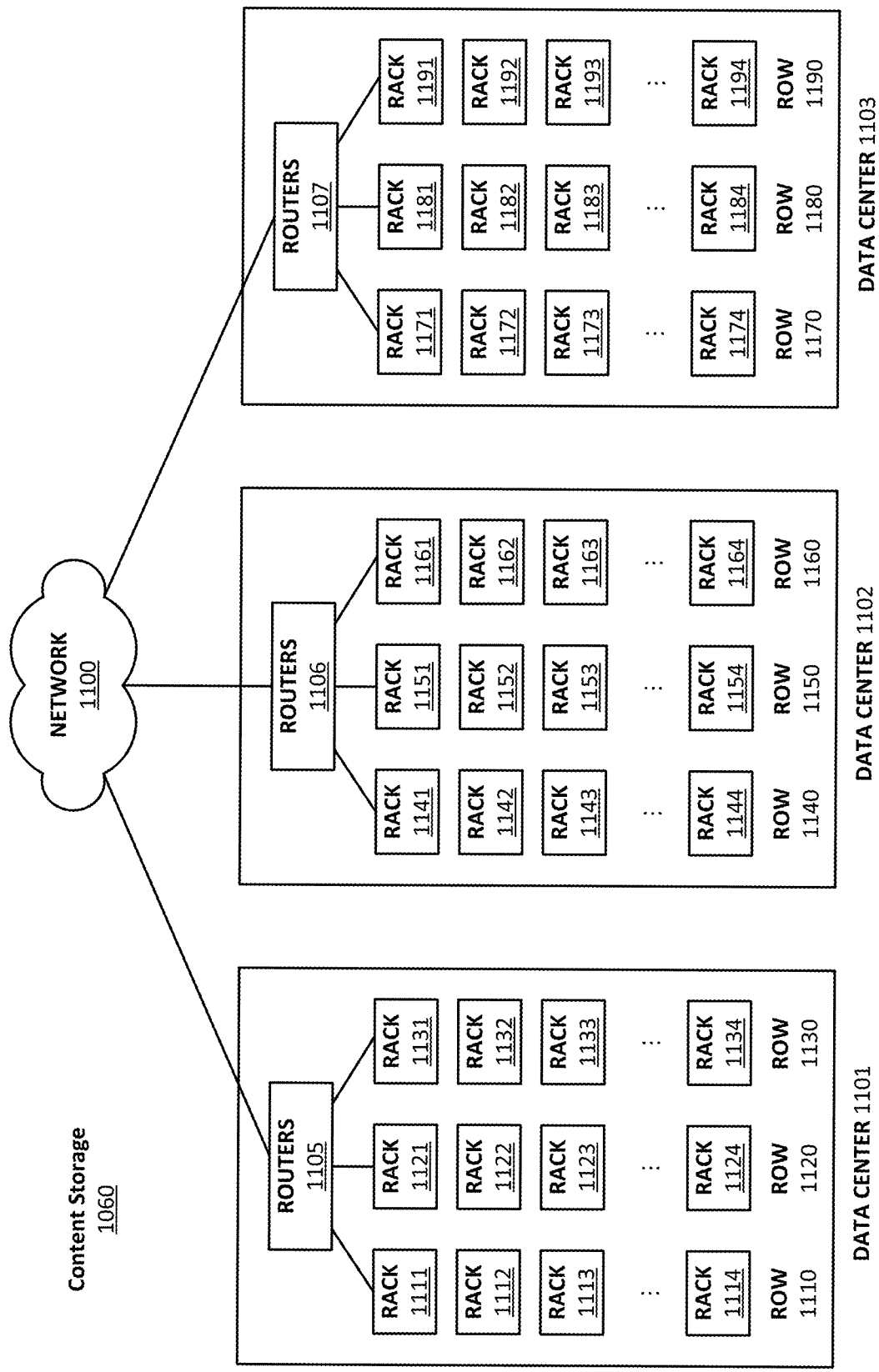
FIG. 11 illustrates an example data hosting environment in the context of which a data storage scheme switching method is performed, in some embodiments.

One or more data centers may provide the infrastructure for the content item block storage system 1060. FIG. 11 illustrates an example data storage system 1060 (from FIG. 10) that encompasses a set of data centers 1101-1103, according to some possible implementations of the present invention.

According to some embodiments, data storage system 1060 can include a set of geographically distributed data centers 1101-1103 that may be located in different states, different countries or even on different continents.

Data centers 1101-1103 may be coupled together through a network 1100, wherein network 1100 can be a private network with dedicated communication links, or a public network, such as the Internet, or a virtual-private network (VPN) that operates over a public network.

Communications to each data center pass through a set of routers that route the communications to specific storage nodes within each data center. More specifically, communications with data center 1101 pass through routers 1105, communications with data center 1102 pass through routers 1106, and communications with data center 1103 pass through routers 1107.

As illustrated in FIG. 11, routers 1105-1107 may channel communications to storage devices within the data centers, wherein the storage devices are incorporated into servers that are housed in racks, wherein the racks are organized into rows within each data center. For example, the racks within data center 1101 are organized into rows 1110, 1120 and 1130, wherein row 1110 includes racks 1111-1114, row 1120 includes racks 1121-1124 and row 1130 includes racks 1131-1134. The racks within data center 1102 are organized into rows 1140, 1150 and 1160, wherein row 1140 includes racks 1141-1144, row 1150 includes racks 1151-1154 and row 11160 includes racks 1161-1164. Finally, the racks within data center 1103 are organized into rows 1170, 1180 and 1190, wherein row 1170 includes racks 1171-1174, row 1180 includes racks 1181-1184 and row 1190 includes racks 1191-1194.

As illustrated in FIG. 11, data storage system 1060 may be organized hierarchically, comprising multiple data centers, wherein machines within each data center are organized into rows, wherein each row includes one or more racks, wherein each rack includes one or more servers, and wherein each server (also referred to herein as an "object storage device"

(OSD)) includes one or more data storage media devices (e.g., one or more hard disks).

Data Storage System

Figure 12:
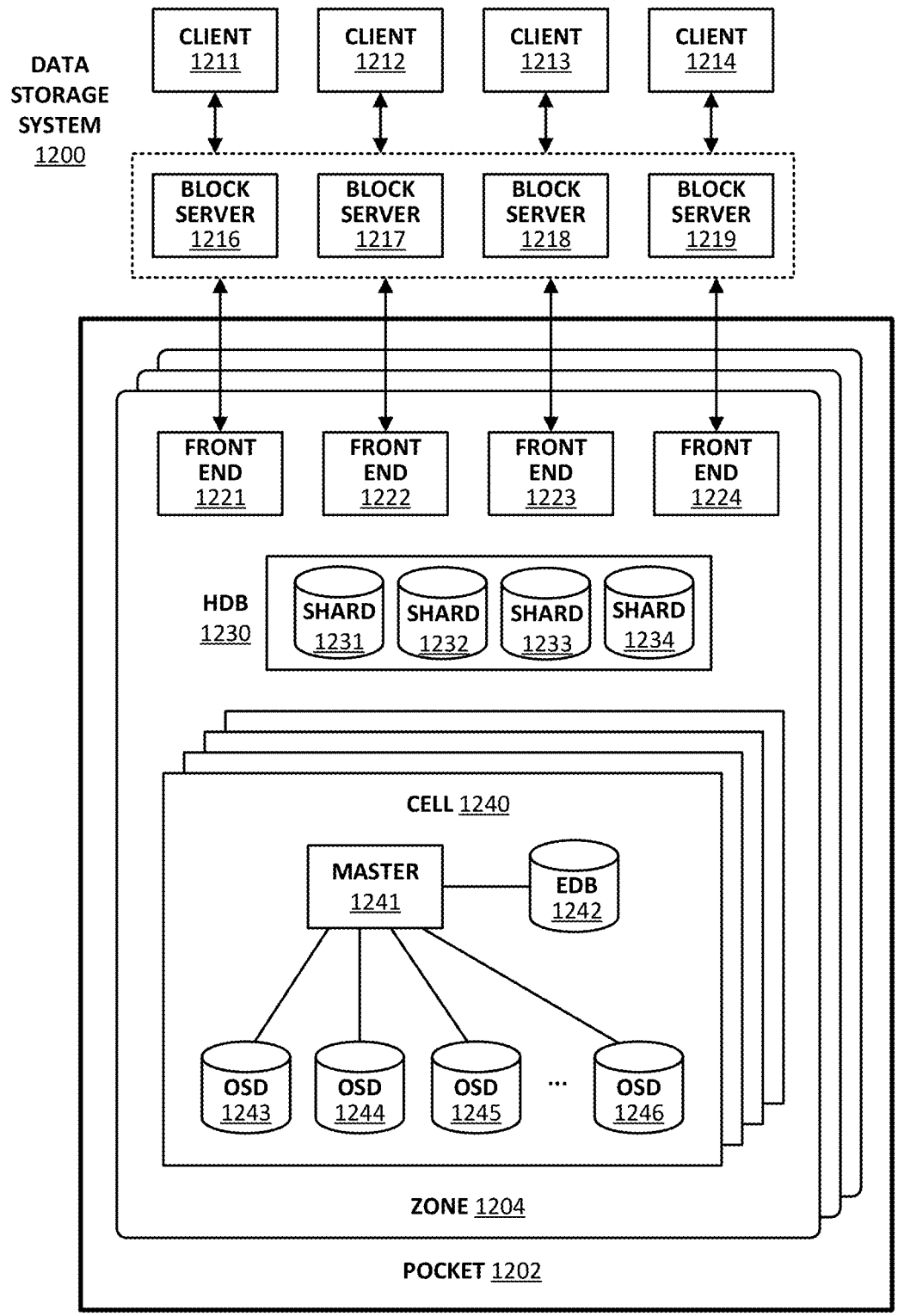
FIG. 12 illustrates an example distributed data storage system in the context of which a data storage scheme switching method is performed, in some embodiments.

FIG. 12 illustrates the logical structure of an example data storage system 1200 in which the techniques for fair data scrubbing may be implemented, according to some possible implementations of the present invention.

As illustrated in FIG. 12, data storage system 1200 may include a logical entity called a "pocket" 1202. Logically, each pocket may be completely distinct, and nothing may be shared between pockets. For example, in some possible implementations, system 1200 provides a "block storage pocket" to store data files, and a "thumbnail pocket" to store thumbnail images for data objects. Note that the applications specify which pockets are to be accessed.

Within a pocket one or more "zones" may exist that are associated with physical data centers, and these physical data centers can reside at different geographic locations. For example, one data center might be located in California, another data center might be located in Virginia, and another data center might be located in Europe. For fault-tolerance purposes, data can be stored redundantly by maintaining multiple copies of the data on different servers within a single data center and also across multiple data centers.

For example, when a data item first enters a data center, it can be initially replicated to improve availability and provide fault tolerance. It can then be asynchronously propagated to other data centers.

Note that storing the data redundantly can simply involve making semantic mirrors of data items, or alternatively using a more space-efficient encoding scheme, such as erasure codes (e.g., Reed-Solomon codes) or Hamming codes to provide fault tolerance. Each of these may be different data storage schemes.

Within each zone (such as zone 1204 in FIG. 12), there may exist a set of front ends 1221-1224, a hash database (HDB) 1230 and a set of "cells," such as cell 1240 illustrated in FIG. 12. A typical cell 1240 includes a number of object storage devices (OSDs) 1243-1246, wherein the individual OSDs 1243-1246 may include storage devices that actually store content item blocks.

Cell 1240 may also include a "master" 1241, which may be in charge of managing OSDs 1243-1246 and an extent database (EDB) 1242 described in more detail below. Note that HDB 1230 and EDB 1242 may be logical databases which can be stored redundantly in multiple physical databases to provide fault tolerance.

Master 1241 may perform a number of actions. For example, master 1241 can determine how many writeable extents the system has at any point in time. If system 1200 runs out of extents, master 1241 can create new extents and allocate them to the storage devices. Master 1241 can also monitor OSDs and associated storage devices, and if any OSD or storage device fails, master 1241 can migrate the associated extents to other OSDs.

As illustrated in FIG. 12, a number of block servers 1216-1219, which are typically located in a data center associated with a zone, can service requests from a number of clients 1211-1214. For example, clients 1211-1214 can comprise applications running on client machines and/or devices that access data items in data storage system 1200. Block servers 1216-1219 in turn can forward the requests to front ends 1221-1224 that may be located within specific zones, such as zone 1204 illustrated in FIG. 12. Note that clients 1211-1214 may communicate with front ends 1221-1224 through block servers 1216-1219, and the front ends 1221-1224 may be the only machines within the zones that have public IP addresses.

Files to be stored in data storage system 1200 may comprise one or more content item blocks that are individually stored in data storage system 1200. For example, a large file can be associated with multiple content item blocks, wherein each content item block may be 1 MB to 4 MBs in size.

Moreover, each content item block may be associated with a "hash" that serves as a global identifier for the content item block. The hash can be computed from the content item block by running the content item block through a hash function, such as a SHA-256 hash function. The SHA-256 hash function is defined as a Federal Information Processing Standard (FIPS) by the U.S. National Institute of Standards and Technology (NIST). The hash may be used by data storage system 500 to determine where the associated content item block may be stored.

Get Operation

System 1200 may perform a number of operations while processing data accesses on behalf of clients 1211-1214. For example, when a get( ) operation is received along with an associated hash, the hash may be used to perform a lookup in HDB 1230. This lookup may return an identifier for an extent and associated cell where the content item block is stored.

To streamline failure-recovery operations, a large number of content item blocks can be aggregated into larger extents. For example, a number of 1-4 MB content item blocks can be aggregated into a single 1 GB extent, wherein each extent may be stored in a specific cell. This can enable the system to manipulate a small number of extents during a failure-recovery operation instead of manipulating a large number of individual content item blocks. Aggregating content item blocks into extents can also greatly decrease the amount of metadata the system has to maintain and manipulate; this may be advantageous because metadata is computationally expensive to maintain and manipulate.

Because a large number of content item blocks can exist in system 1200, HDB 1230 can be potentially be very large. If HDB 1230 is very large, it can be advantageous to structure HDB 1230 as a "sharded" database. For example, when performing a lookup based on a hash in HDB 1230, the first 8 bits of the hash can be used to associate the hash with one of 256 possible shards, and this shard can be used to direct the lookup to an associated instance of HDB 1230.

For example, as illustrated in FIG. 12, HDB 1230 can comprise 4 instances 1231-1234, wherein instance 1231 is associated with shards 1-64, instance 1232 is associated with shards 65-128, instance 1233 is associated with shards 129-192 and instance 1234 is associated with shards 193-256.

In some possible implementations, HDB 1230 can be divided into more or fewer instances. Note that a zone can include a "ZooKeeper™ cluster" that is responsible for mapping shards to specific target cells and also mapping shards to physical HDB machines.

HDB instances 1231-1234 may be logical databases that are mapped to physical databases, and to provide fault tolerance, each logical database can be redundantly stored in multiple physical databases. For example, in some possible implementations, each HDB instance may map to three physical databases. If system 1200 is very large (for example containing trillions of content item blocks), HDB 1230 may be too large to fit in random-access memory. In this case HDB 1230 will mainly be stored in non-volatile storage, which for example, can comprise flash drives or disk drives.

After the extent and associated cell are identified for the get( ) operation, system 1200 may perform a lookup in an extent database (EDB) 1242 in the associated cell 1240. This lookup may return an identifier for an object storage device (OSD) 1243 where the extent may be located. Note that because each extent may be fairly large (e.g., 1 GB) and may contain a large number of content item blocks, EDB 1242 may be relatively small and may be stored in random-access memory, which can greatly speed up the lookup process.

Finally, within the OSD, system 1200 may perform a lookup based on the extent and the hash to determine an offset and a length for the content item block in a write-ahead log that stores content item blocks for the extent. System 1200 may then return the content item block from the determined offset in the write-ahead log. Note that because system 1200 may be designed to store "immutable data" that does not change after it is written, it can be more efficient to store the immutable data in a write-ahead log, as opposed to a random-access structure. Because the data may not be overwritten, writes may not require more complex and time-consuming random-access lookup mechanisms.

Put Operation

During a put( ) operation, system 1200 may receive a content item block to be written from a client. To process the put( ) operation, system 1200 may first compute a hash from the content item block, for example using the SHA-256 technique described above. Next, system 1200 may select a writeable extent and an associated cell for the content item block. Note that front ends 1221-1224 periodically poll all the EDBs to identify and then cache writeable extents. This can enable front ends 1221-1224 to keep track of a number of extents (e.g., 10 to 100 extents) that they know are writeable at any given time. Then, when a put( ) operation is subsequently received, a front end may simply select a cached extent that it knows is writable.

Within the associated cell, system 1200 may use an identifier for the selected extent to perform a lookup in the EDB. This lookup may return one or more OSDs for the extent. Note that the extent may be replicated across multiple OSDs to provide fault tolerance. Within the OSDs, system 1200 may append the content item block to a write-ahead log that stores content item blocks for the extent. After the data is stably written to the OSDs, system 1200 may write the hash-to-extent mapping to the HDB 1230.

Note that the master 1241 may modify the EDB 1242 and the front end 1221 may modify the HDB 1230. In general, master 1241 may be concerned with reliability of storage, and hence may perform operations to facilitate redundancy and rebalancing, while the front end 1221 may be generally concerned with finding information and may simply map hashes to logical constructs, such as extents.

Master 1241 may perform various operations to detect and handle failures. More specifically, master 1241 may periodically perform health checks on OSDs. If master 1241 detects a failure in an OSD, the associated extents may be degraded and the master may set the extents to be non-writable. Note that get( ) operations nay have to access the extents where the blocks are stored, but put( ) operations can be directed to any extent that is currently writeable, so when a problem happens with an extent, system 1200 simply may mark the extent as non-writeable. System 1200 can continue performing get( ) operations on the degraded extent, because there exist multiple copies of the degraded extent.

To handle a failure associated with an extent, master 1241 may tell the associated OSDs to freeze the extent. Master 1241 may then tell the OSDs to replicate the extent to a new OSD. System 1200 may then add the new OSD to the cluster, increment the generation number for the OSD, and mark the extent as writeable. Note that when a degraded OSD is restarted after a failure, it may not accept any reads because its generation number is old. System 1200 may guarantee that every OSD in the current generation has valid data. Also note that in this case where an extent is replicated to a new OSD, the extent may be considered never scrubbed data at the extent's new OSD until the data is data scrubbed for the first time at the extent's new OSD.

System 1200 may also include mechanisms to perform compaction operations. Although the data stored in system 1200 may be immutable, system 1200 may often need to delete data items when users remove them from the system. In some possible implementations, system 1200 tracks deleted data items in a log, and when the usable storage in a given extent falls below a threshold, system 1200 compacts the extent. In this case, where an extent is compacted, the extent may be considered never scrubbed data after the extent is compacted. This is so even if, prior to the compaction operation, the extent was considered already scrubbed data. The reason for this is that the compaction operation can result in the extent being stored on different portion of a hard disk or on a new hard disk, perhaps even at a new OSD in system 1200.

Object Storage Device

Figure 13A:
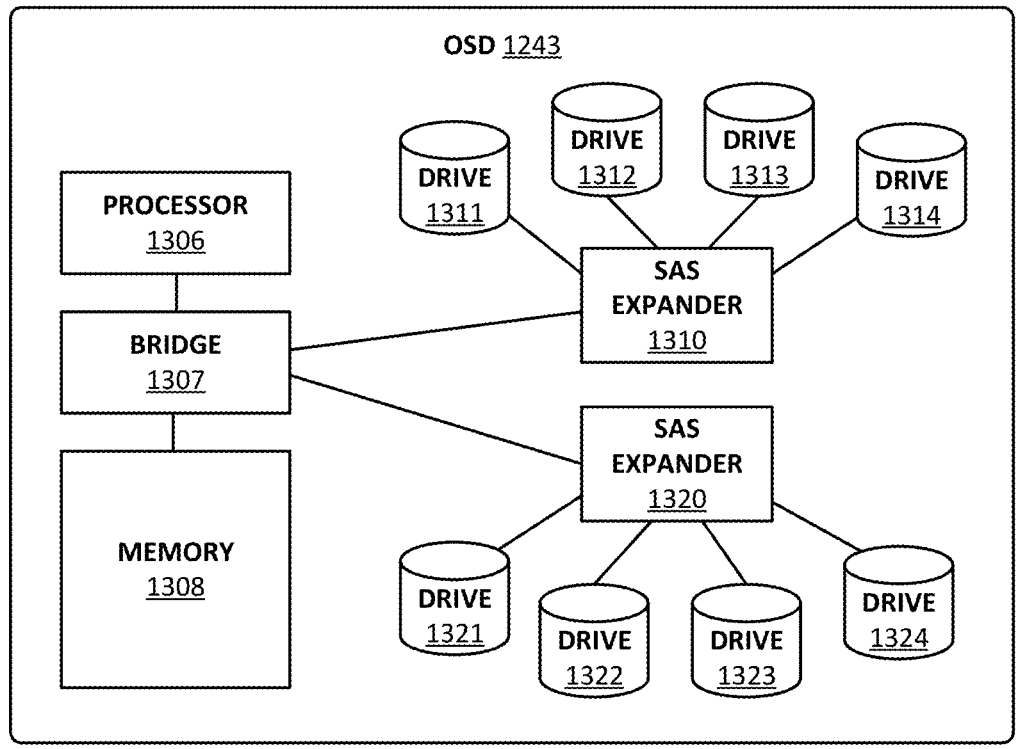
FIG. 13A illustrates an example object storage device in the context of which a data storage scheme switching method is performed, in some embodiments.

FIG. 13A illustrates the structure of an example object storage device (OSD) 1243 in accordance with some embodiments. As illustrated in FIG. 13A, OSD 1243 may include a processor 1306 that is connected to a memory 1308 through a bridge 1307.

Processor 1306 is also coupled to Serial Attached SCSI (SAS) expanders 1310 and 1320, where SAS expander 1310 is coupled to data storage media devices (e.g., hard disks) 1311-1314 and SAS expander 1320 is coupled to data storage media devices (e.g., hard disks) 1321-1324. Note that SAS expanders 1310 and 1320 may be coupled to more or fewer hard disks.

A data storage media device (e.g., 1310-1314, 1321-1324) can be, but is not required to be, a hard disk. The hard disk can be based on conventional magnetic recording (CMR), perpendicular magnetic recording (PMR), shingled magnetic recording (SMR), or heat-assisted magnetic recording (HAMR) storage technology. Each of these different hard disk technologies may be different data storage schemes. The system may have a mix of different types of hard disks. Further, a hard disk in the system is not limited to any particular magnetic storage technology. In some possible implementations, a hard disk has a fourteen (14) terabyte capacity. However, a hard disk can have greater or smaller capacity. And different hard disks in the system can have different storage capacities.

Figure 13B:
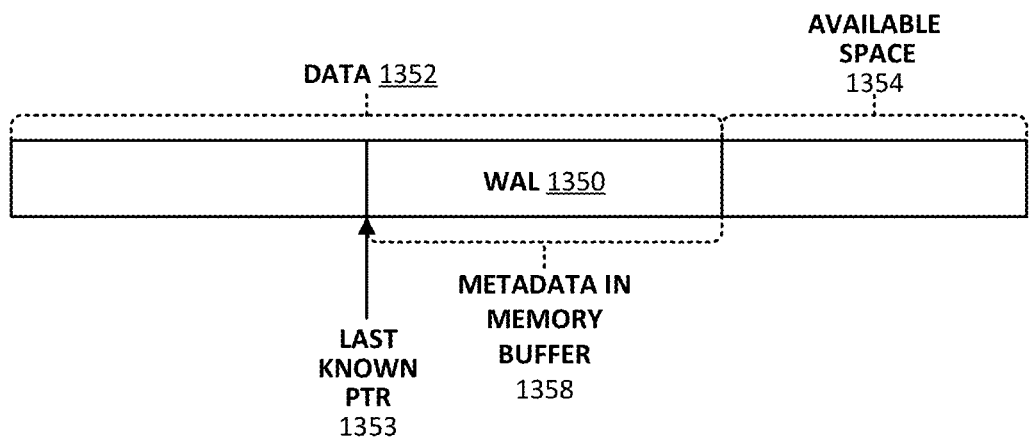
FIG. 13B illustrates an example write-ahead log in the context of which a data storage scheme switching method is performed, in some embodiments.

FIG. 13B illustrates the structure of an example write-head log (WAL) 1350 which may be maintained with an OSD (e.g., OSD 1243), according to some possible implementations of the present invention.

WAL 1350 provides a log-structured data store which may be advantageous for storing immutable data. WAL 1350 may include one or more 1 GB extents. As illustrated in FIG. 13B, an extent can include a "data portion" 1352 that has already been written to, and an unwritten portion that contains available space 1354. The content item blocks that are stored within data portion 1352 are associated with metadata that, for example, contains hashes and the offsets for the content item blocks. To improve performance, metadata associated with recently written content item blocks 1358 can be stored in a memory buffer. When the system recovers from a failure, all of the metadata can be reconstructed by scanning through WAL 1350 starting from a last known pointer 1353.

During a put( ) operation, system 1200 may synchronously append the content item block and an associated header to the WAL 1350, wherein the header includes a number of data items associated with the content item block, including the hash and the length of the content item block. At the same time, system 1200 may synchronously add metadata to the memory buffer. When an extent becomes full, system 1200 may seal the extent, and the extent may not get modified again.

During a get( ) operation, system 1200 may check the memory buffer to find the offset and length for the content item block. The system may then use the offset and length to read the content item block from WAL 1350.

Example Content Item Access Characteristics

Figure 14:
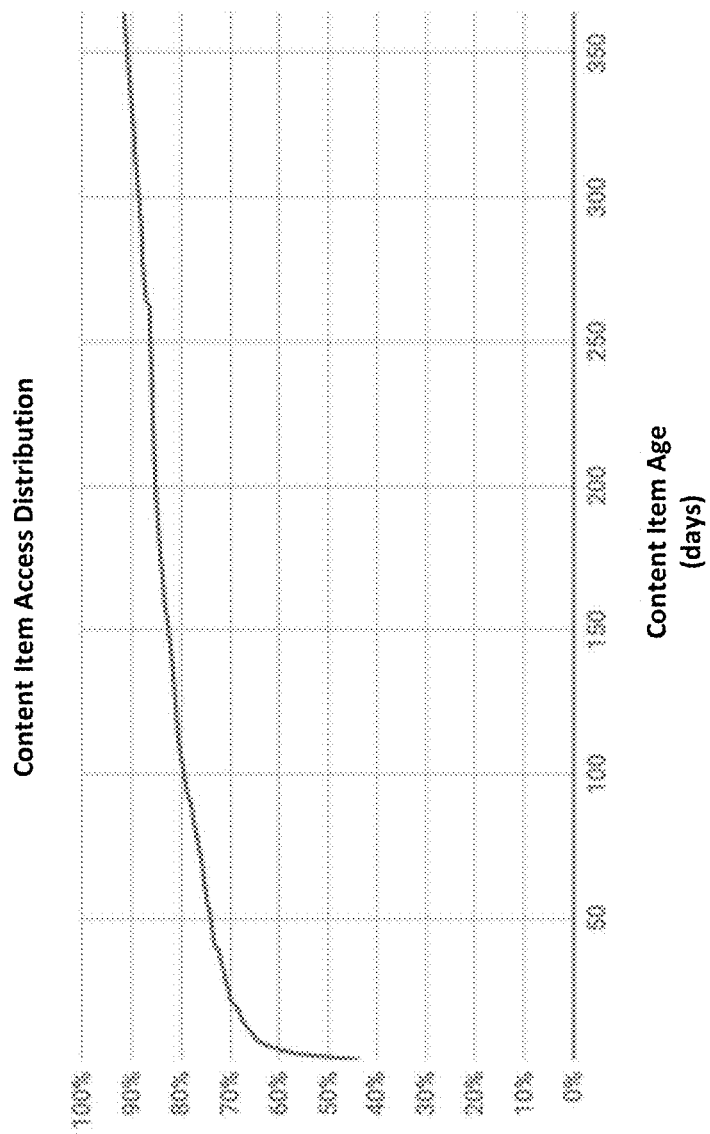
FIG. 14 plots the cumulative distribution function of content item access in a large-scale distributed data storage system over a year, in some embodiments.

Content items stored in a large-scale distributed data storage system such as, for example, a large-scale centrally hosted network file system or other large-scale network service, can have access characteristics that vary over time. For example, some content items may be accessed very frequency within the first few hours of being uploaded to the system and less frequently thereafter. For example, FIG. 14 plots the cumulative distribute function of content item accesses uploaded to a particular large-scale centrally hosted network file system over one year. As shown in FIG. 14, over 40% of content item accesses in the particular large-scale distributed data storage system are for content items created in the system in the past day, over 70% for content items created in the system in the past month, and over 90% for content items created in the system in the past year. The accesses that occur in the first day may be triggered by automatic processes performed by the system when a new content item is uploaded to the system to enhance the end-user experience. Such automatic processes may include, for example, performing optical character recognition on the new content item, parsing text of the new content item to extract search tokens, and/or generating at thumbnail or web preview of the new content item. End-users often share new content items with other end-users (e.g., via sharing module 1030) which causes the new content items to be synchronized to the other end-users' computing devices (e.g., via synchronization module 1032) resulting in accesses of the new content items in the system. Generally speaking, end-users may be more likely to accesses content items they recently uploaded to the system (e.g., within a few days) than content items they uploaded long ago (e.g., a few months or a year ago).

Example Data Redundancy Schemes

According to some embodiments, content items are switched between different data redundancy schemes in a large-scale distributed data storage system such as, for example, a large-scale centrally hosted network file system. Some example data redundancy schemes between which content items can be switched will now be described.

A First Data Redundancy Scheme

According to a first data redundancy scheme, the system splits content items into chunks, called blocks, up to a predetermined size (e.g., 4 MB). The blocks themselves may be immutable and metadata operations and associated operations around accessing the blocks may be handled by a metadata computing system that operates in conjunction with the distributed data storage system in which the blocks are stored.

The first data redundancy scheme may be configured with spinning data storage devices (e.g., hard disk), which have the advantage of being cheap, durable, and provide relatively high data access bandwidth. A new content item initially uploaded to the system may be initially stored according to n-way replication across a relatively large number of data storage devices. Later, the n-way replicated content item may be encoded in a more efficient (less data storage cost) erasure-coded format.

Figure 15:
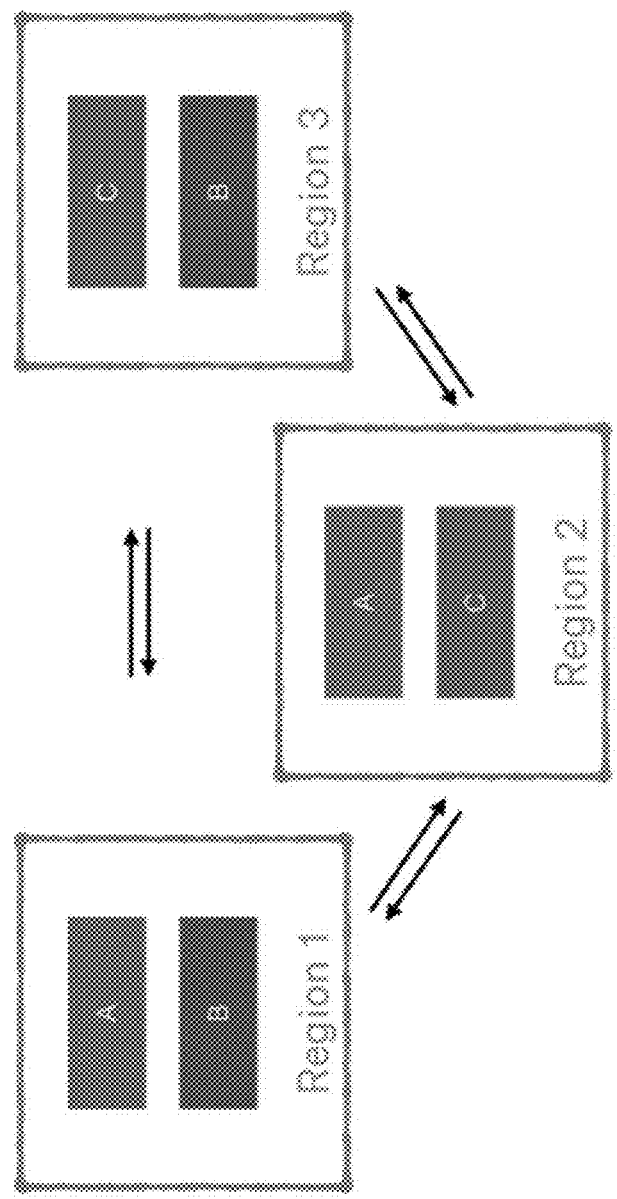
FIG. 15 illustrates a first data redundancy scheme, according to some embodiments.

The first data redundancy scheme may support replication of content items in multiple different geographic regions to survive large-scale disasters. FIG. 15 depicts geographic replication of blocks of content items across regions, according to some embodiments. Each of the regions Region 1, Region 2, and Region 3 may correspond to different geographically distributed data center facilities (e.g., as in FIG. 11). The regions may be separated from each other by only tens or a few hundred miles. However, it is possible for the regions to be separated by thousands of miles.

In some embodiments, according to the first data redundancy scheme, each block of a content item is replicated or erasure-coded in at least two regions. For example, block A is replicated or erasure-coded in Region 1 and Region 2, block B is replicated or erasure-coded in Region 1 and Region 3, and block C is replicated or erasure-coded in Region 2 and Region 3. With this, if a large-scale disaster destroyed, for example, Region 2, a copy of blocks A and C are still available in Region 1 and Region 3, respectively.

One drawback of the first data redundancy scheme is that it effectively doubles the amount of data that is stored. For example, instead of replicating or erasure coding block A just within Region 1, block A is also replicated or erasure coded in Region 2. However, a benefit of the first data redundancy scheme is that a block can retrieved from a single region. For example, block A can be retrieved from Region 1 or Region 2.

A Second Data Redundancy Scheme

According to a second data redundancy scheme, a data block of a content item is split into multiple fragments and the fragments are striped across multiple regions. The second data storage scheme can (but does not necessarily always) have a reduced data storage cost relative to the first data storage scheme because of the reduced replication factor of the second data storage scheme. However, the second data storage scheme can (but does not necessarily always) have a higher data access cost relative to the first data storage scheme because data must be retrieved from at least two regions in order to reconstruct a content item block.

Figure 16:
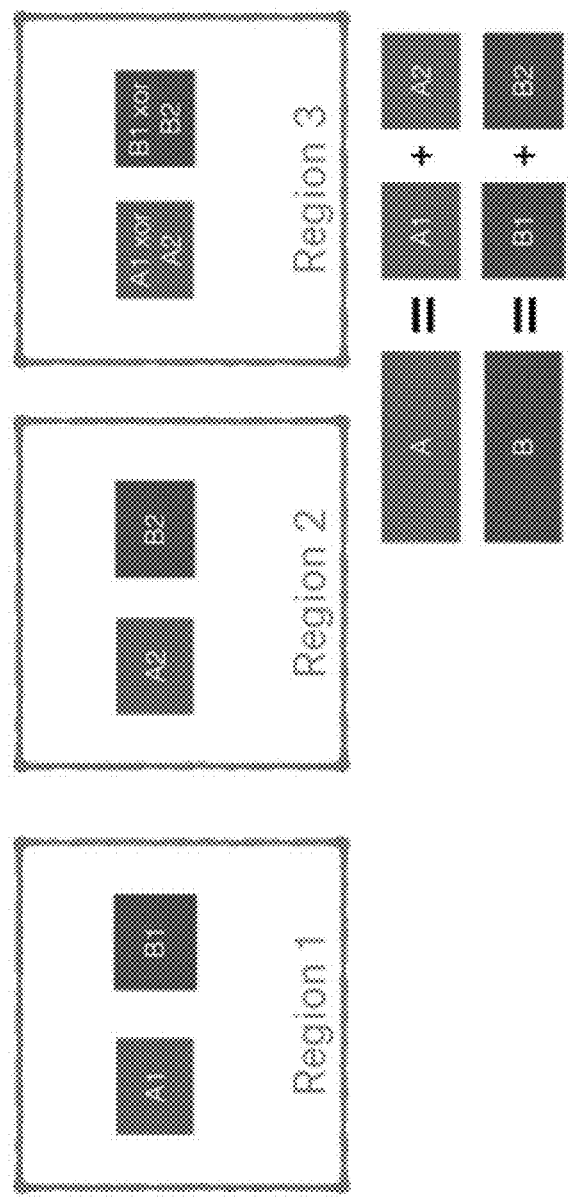
FIG. 16 illustrates a second data redundancy scheme, according to some embodiments.

FIG. 16 illustrates the second data redundancy scheme by an example, according to some embodiments. Block A is split into fragments A1 and A2. Block B is split into fragments B1 and B2. Fragments A1 and B1 are stored in Region 1. Fragments A2 and B2 are stored in Region 2. Region 3 stores a parity fragment A1 XOR A2 for fragments A1 and A2. Region 3 also stores a parity fragment B1 XOR B2 for fragments B1 and B2. While in this example three regions are used and XOR is used for generating the parity fragments, the second data redundancy scheme can be applied more generally to a greater number of regions and using different parity generation schemes (e.g., Reed-Solomon erasure codes or the like).

Referring to the example of FIG. 16, to put (access) block A of a content item, the block is split into two data fragments where first data fragment A1 is placed in Region 1 and second data fragment A2 is placed in Region 2. A third parity fragment is computed from the XOR of data fragments A1 and A2 and placed in Region 3. To get (access) block A of the content item, a get request may be issued to all regions and fastest two responses used, ignoring the third. If the fastest two responses include parity fragment A1 XOR A2, the data access cost of the required XOR operation (or erasure decoding operation) to reconstruct block A may be negligible to the data access cost of reading the two fragments (e.g., data fragment A2 and parity fragment A1 XOR A2) from data storage devices and transferring the two fragments over a data network where the XOR operation (or erasure decoding operation) is applied to recover block A.

In the example of FIG. 15, the first data redundancy scheme provides a 1+1 replication scheme, with one data fragment equal to one block of a content item and one parity fragment per region, in addition to replication within each region. In the example of FIG. 15, the second data redundancy scheme provides a 2+1 replication scheme, with two data fragments equal to one block of a content item and one parity fragment. Thus, in these examples, the data storage cost of the second data redundancy scheme is 25% lower than the first data redundancy scheme.

The data storage cost savings provided by the second data redundancy scheme can be generalized to a greater number of regions. For example, if four regions are used with a loss tolerance of at most any one of the four regions, then the second data redundancy scheme provides a 4+1 replication scheme and a 33% data storage cost savings over the first data redundancy scheme applied to the four-region example. The second data redundancy scheme can support other replications schemes (e.g., 4+1 or 5+2), according to the requirements of the particular implementation at hand such as, for example, a trade-off between data storage cost savings and the number of simultaneous region losses that are tolerable.

According to some embodiments, the first data redundancy scheme is a hotter storage with respect to the second data redundancy scheme and the second data redundancy scheme is a colder storage with respect to the first data redundancy scheme because of a lower data access cost of the first data redundancy scheme compared to the second data redundancy scheme and a higher data storage cost of the first data redundancy scheme compared to the second data redundancy scheme.

According to some embodiments, hotter to colder content item access pattern prediction method 500 described above is performed to determine when to switch content items stored according to the first data redundancy scheme to the second data redundancy scheme.

According to some embodiments, colder to hotter content item access pattern prediction method 600 described above is performed to determine when to switch content items stored according to the second data redundancy scheme to the first data redundancy scheme.

Computing System Implementation

In some embodiments, a computing system (e.g., computing device 1700) includes one or more processors and storage media coupled to the one or more processors. The one or more processors and the storage media of the computing system may be provided by one or more computing devices. An example computing device 1700 is described below with respect to FIG. 17. The storage media stores instructions which, when executed by the computing system, cause the computing system to perform any of the above methods.

In some embodiments, one or more non-transitory media (e.g., storage media) stores instructions which, when executed by a computing system, cause the computing system to perform any of the above methods.

In some embodiments, a computing device (e.g., 1700) hosts one or more hypervisors that operate on the computing device and emulate and/or virtualize computing hardware. A hypervisor can be a Type-1 (bare-metal hypervisor) or Type-2 hypervisor (hosted hypervisor), for example.

In some embodiments, a computing device employs operating system-level virtualization in addition to, or in the absence of, one or more hypervisors. With operating system-level virtualization, the operating system kernel facilitates multiple isolated user space instances sometimes referred to as containers, zones, virtual private servers, partitions, virtual environments, virtual kernels, jails, etc.

In some embodiments, multiple computing devices in a distributed computing environment performs any of the above methods. In such an environment, computing devices may be continuously, periodically, or intermittently interconnected by one or more data communications networks (e.g., one or more Internet Protocol (IP) networks.)

Example Computing Device

Figure 17:
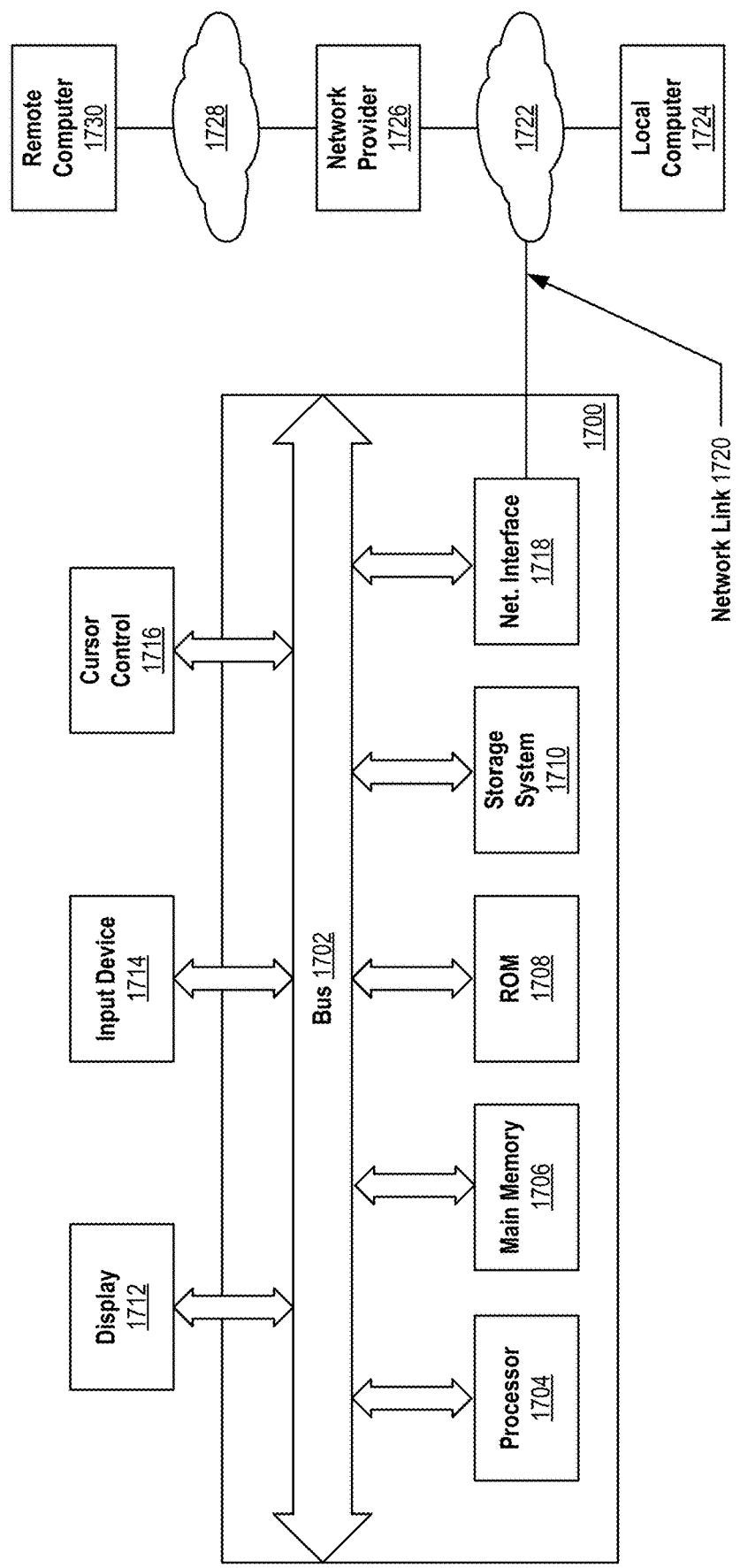
FIG. 17 illustrates an example computing device, according to some embodiments.

FIG. 17 illustrates example computing device 1700 according to some embodiments. Computing device 1700 includes bus 1702 or other communication mechanism for communicating information, and one or more hardware processors 1704 coupled with bus 1702 for processing information. Computing device 1700 is just one example of a possible computing device that may be used in an implementation. Other computing device configurations having more, fewer, or different components may be used in an implementation.

Hardware processor(s) 1704 include, for example, one or more general-purpose microprocessors, central processing units (CPUs) or cores thereof, graphics processing units (GPUs), or systems on a chip (SoCs).

Computing device 1700 also includes main memory 1706, implemented by one or more volatile memory devices, coupled to bus 1702 for storing information and instructions to be executed by processor(s) 1704. Main memory 1706 also may be used for storing temporary variables or other intermediate information during execution of instructions by processor(s) 1704.

Computing device 1700 includes read-only memory (ROM) 1708 or other static storage device coupled to bus 1702 for storing static information and instructions for processor(s) 1704.

Storage system 1710 implemented by one or more non-volatile memory devices is provided and coupled to bus 1702 for storing information and instructions.

Computing device 1700 is coupled via bus 1702 to display 1712, such as a liquid crystal display (LCD), a light emitting diode (LED) display, or a cathode ray tube (CRT), for displaying information to a computer user. Display 1712 may be combined with a touch sensitive surface to form a touch screen display. The touch sensitive surface may be an input device for communicating information including direction information and command selections to processor(s) 1704 and for controlling cursor movement on display 1712 via touch input directed to the touch sensitive surface such by tactile or haptic contact with the touch sensitive surface by a user's finger, fingers, or hand or by a hand-held stylus or pen. The touch sensitive surface may be implemented using a variety of different touch detection and location technologies including, for example, resistive, capacitive, surface acoustical wave (SAW) or infrared technology.

Input device 1714, including alphanumeric and other keys, is coupled to bus 1702 for communicating information and command selections to processor(s) 1704. Another type of user input device is cursor control 1716, such as, for example, a mouse, a trackball, or cursor direction keys, for communicating direction information and command selections to processor(s) 1704 and for controlling cursor movement on display 1712. For example, his input device may have two degrees of freedom in two axes, a first axis (e.g., x) and a second axis (e.g., y), that allows the device to specify positions in a plane.

In some embodiments, computing device 1700 in response to processor(s) 1704 executing instructions contained in main memory 1706 performs any of the above methods. Such instructions are read into main memory 1706 from another storage medium, such as storage system 1710. Execution of the instructions contained in main memory 1706 may cause processor(s) 1704 to perform any of the above methods. Hard-wired circuitry may be used in place of or in combination with instructions to perform any of the above methods.

The term "storage media" as used herein refers to any non-transitory media that store data and/or instructions that cause a machine to operate in a specific fashion. Such storage media may comprise non-volatile media (e.g., storage system 1710) and/or volatile media (e.g., main memory 1706). Non-volatile media includes, for example, read-only memory (e.g., EEPROM), flash memory (e.g., solid-state drives), magnetic storage devices (e.g., hard disk drives), and optical discs (e.g., CD-ROM). Volatile media includes, for example, random-access memory devices, dynamic random-access memory devices (e.g., DRAM) and static random-access memory devices (e.g., SRAM).

Storage media is distinct from but may be used in conjunction with transmission media. Transmission media participates in transferring information between storage media. For example, transmission media includes coaxial cables, copper wire and fiber optics, including the circuitry that comprise bus 1702. Transmission media can also take the form of acoustic or light waves, such as those generated during radio-wave and infra-red data communications.

Computing device 1700 also includes data communications network interface 1718 coupled to bus 1702. Network interface 1718 may provide a two-way data communication coupling to a wired or wireless network link 1720 that is connected to a local, cellular or mobile network 1722. For example, network interface 1718 may be IEEE 802.3 wired "ethernet" card, an IEEE 802.11 wireless local area network (WLAN) card, an IEEE 802.15 wireless personal area network (e.g., Bluetooth) card or a cellular network (e.g., GSM, LTE, etc.) card to provide a data communication connection to a compatible wired or wireless network. Network interface 1718 may send and receive electrical, electromagnetic or optical signals that carry digital data streams representing various types of information.

Network link 1720 provides data communication through one or more networks to other data devices. For example, network link 1720 may provide a persistent, periodic, or intermittent connection through network 1722 to local computing device 1724 that is also connected to network 1722 or to data communication equipment operated by a network access provider 1726 such as, for example, an internet service provider or a cellular network provider. Network access provider 1726 in turn may provide data communication connectivity to another data communications network 1728 (e.g., the Internet). Networks 1722 and 1728 both may use electrical, electromagnetic or optical signals that carry digital data streams. The signals through the various networks and the signals on network link 1720 and through network interface 1718, which carry the digital data to and from computing device 1700, are example forms of transmission media. Computing device 1700 may send messages and receives data, including program code, through the networks 1722 and 1728, network link 1720 and network interface 1718. In the Internet example, a remote computing device 1730 may transmit a requested code for an application program through network 1728, network 1722 and network interface 1718. The received code may be executed by processor 1704 as it is received, and/or stored in storage device 1710, or other non-volatile storage for later execution.

CONCLUSION

Reference herein to "some embodiments" means that a particular feature, structure, or characteristic is described in connection with and can be included in at least one embodiment of the invention. The appearances of the phrase "in some embodiments" in various places in the specification are not necessarily all referring to the same embodiment or embodiments, nor are separate or alternative embodiments mutually exclusive of other embodiments.

For situations in which the above systems and methods collect information about end-users, the end-users may be provided with an opportunity to opt in/out of programs or features that may collect personal information (e.g., information about a user's preferences or usage of a smart device). In addition, in some instances, certain data may be anonymized in one or more ways before it is stored or used, so that personally identifiable information is removed. For example, an end-user's identity may be anonymized so that the personally identifiable information cannot be determined for or associated with the end-user, and so that end-user preferences or end-user interactions are generalized (for example, generalized based on end-user demographics) rather than associated with a particular end-user.

Although some of various drawings illustrate a number of logical stages in a particular order, stages that are not order dependent may be reordered and other stages may be combined or broken out. While some reordering or other groupings are specifically mentioned, the ordering and groupings presented herein are not an exhaustive list of alternatives.

In the foregoing detailed description and in the appended claims, although the terms first, second, etc. are, in some instances, used herein to describe various elements, these elements should not be limited by these terms. These terms are only used to distinguish one element from another. For example, a first computing device could be termed a second computing device, and, similarly, a second computing device could be termed a first computing device. The first computing device and the second computing device are both computing devices, but they are not the same computing device.

As used in the foregoing detailed description and in the appended claims, the singular forms "a," "an," and "the" are intended to include the plural forms as well, unless the context clearly indicates otherwise. As used in the foregoing detailed description and in the appended claims, the term "and/or" refers to and encompasses any and all possible combinations of one or more of the associated listed items.

As used in the foregoing detailed description in the appended claims, the terms "based on," "according to," "includes," "including," "comprises," and/or "comprising," specify the presence of stated features, integers, steps, operations, elements, and/or components, but do not preclude the presence or addition of one or more other features, integers, steps, operations, elements, components, and/or groups thereof.

As used in the foregoing detailed description and in the appended claims, the term "if" is, optionally, construed to mean "when" or "upon" or "in response to determining" or "in response to detecting" or "in accordance with a determination that," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]" or "in accordance with a determination that [a stated condition or event] is detected," depending on the context.

The foregoing detailed description, for purpose of explanation, has been described with reference to specific implementations. However, the illustrative discussions above are not intended to be exhaustive or to limit the scope of the claims to the precise forms disclosed. Many modifications and variations are possible in view of the above teachings. The implementations were chosen in order to best explain the principles underlying the claims and their practical applications, to thereby enable others skilled in the art to best use the implementations with various modifications as are suited to the particular uses contemplated.

The invention claimed is:

1. A computing system comprising:
   one or more processors;
   a non-transitory computer-readable storage medium comprising instructions which, when executed by the one or more processors, cause the computing system to:
   store, at an initial time, a content item according to a first data storage scheme;
   use, at a first time, a first trained machine learning model to compute, based on a first set of one or more historical accesses to the content item between the initial time and the first time, a first probability that the content item will be accessed in the future;
   maintain, based on the first probability, storage of the content item according to the first data storage scheme;
   use, at a second time after the first time, a second trained machine learning model different from the first trained machine learning model to compute, based on a second set of one or more historical accesses to the content item between, a second probability that the content item will be accessed in the future relative to a second reference time that is after the second set of one or more historical accesses have occurred, the second trained machine learning model trained to compute probabilities on the basis of a different time horizon from a time horizon on which the first trained machine learning model is trained;
   switch, based on the second probability, the content item from being stored according to the first data storage scheme to being stored according to a second data storage scheme, wherein the first machine learning model is again used at a third time after the second time in connection with determining whether to switch the content item from being stored in the second data storage scheme to a different data storage scheme.

2. The computing system of claim 1, wherein the second data storage scheme is a colder storage relative to the first data storage scheme.

3. The computing system of claim 1, wherein the initial time corresponds to when a content management system takes a content management action on the content item.

4. The computer system of claim 1, further comprising instructions which, when executed by one or more of the one or more processors, cause the computing system to:
   collect a set of one or more access predictors for the content item;
   generate a set of one or more feature values for the content item based on the set of one or more access predictors; and
   use, at the first time, the first trained machine learning model to compute, based on the set of one or more feature values, the first probability.

5. The computing system of claim 4, wherein the set of one or more access predictors for the content item include at least one or more of:
   a content type of the content item,
   access timing information for the first set of one or more historical accesses,
   a size of the content item,
   a filename of the content item,
   a file path of the content item,
   a number of the first set of one or more historical accesses by a particular user, or
   a type of end-user computing device using a historical access of the first set of one or more historical accesses.

6. A computer-implemented method comprising:
   storing a first content item in a distributed data storage system according to a first data storage scheme;
   using two or more trained machine learning models to compute, based on a first set of one or more historical accesses to the first content item in the distributed data storage system while the first content item is stored in the distributed data storage system according to the first data storage scheme, a first probability that the first content item will be accessed in the distributed data storage system during a first period of time and a second probability that the first content item will be accessed in the distributed data storage system during a second period of time, the two or more trained machine learning models trained using training data corresponding to different time horizons with respect to one another, the one or more historical accesses occurring prior to a reference time that precedes the first and second periods of time; and based on one or more of the first probability and the second probability, storing the first content item in the distributed data storage system according to a second data storage scheme, wherein a first machine learning model of the two or more trained machine learning models trained using a shorter time horizon than one or more other time horizons of the different time horizons is again used in connection with determining whether to switch the content item from being stored in the second data storage scheme to a different data storage scheme.

7. The method of claim 6, wherein:
the first data storage scheme has a first data storage cost, the first data storage cost associated with a storage of the first content item in the distributed data storage system according to the first data storage scheme;
the first data storage scheme has a first data access cost, the first data access cost associated with an access to the first content item in the distributed data storage system while the first content item is stored in the distributed data storage system according to the first data storage scheme;
the second data storage scheme has a second data storage cost, the second data storage cost associated with a storage of the first content item in the distributed data storage system according to the second data storage scheme;
the second data storage scheme has a second data access cost, the second data access cost associated with an access to the first content item in the distributed data storage system while the first content item is stored in the distributed data storage system according to the second data storage scheme;
the first data storage cost is different than the second data storage cost; and
the first data access cost is different than the second data access cost.

8. The method of claim 7, wherein:
the first data storage cost is greater than the second data storage cost; and
the first data access cost is less than the second data access cost.

9. The method of claim 7, wherein:
the first data storage cost is less than the second data storage cost; and
the first data access cost is greater than the second data access cost.

10. The method of claim 6, further comprising:
using one or more machine learning models to compute, based on a second set one or more historical accesses to the first content item in the distributed data storage system while the first content item is stored in the distributed data storage system according to the second data storage scheme, a second probability that the first content item will be accessed in the distributed data storage system during a second period of time that is after the first period of time; and
based on the second probability, storing the first content item in the distributed data storage system according to the first data storage scheme.

11. The method of claim 6, wherein:
the first content item stored in the distributed data storage system according to the first data storage scheme is a first compressed version of the first content item, the first compressed version of the first content item compressed according to a first data compression algorithm; and
the first content item stored in the distributed data storage system according to the second data storage scheme is a second compressed version of the first content item, the second compressed version of the first content item compressed according to a second data compression algorithm.

12. The method of claim 11, wherein:
the first compressed version of the first content item stored in the distributed data storage system according to the first data storage scheme has a higher data storage cost than the second compression version of the first content item stored in the distributed data storage system according to the second data storage scheme; and
the first compressed version of the first content item stored in the distributed data storage system according to the first data storage scheme has a lower data access cost than the second compressed version of the first content item stored in the distributed data storage system according to the second data storage scheme.

13. The method of claim 6, wherein:
wherein the first content item stored in the distributed data storage system according to the first data storage scheme is a first redundant version of the first content item made redundant according to a first data redundancy scheme; and
wherein the first content item stored in the distributed data storage system according to the second data storage scheme is a second redundant version of the first content item made redundant according to a second data redundancy scheme.

14. The method of claim 13, wherein:
the first redundant version of the first content item comprises a plurality of copies of the first content item stored in the distributed data storage system according to the first data redundancy scheme; and
the second redundant version of the first content item comprises an erasure-coding of the first content item stored in the distributed data storage system according to the second data redundancy scheme.

15. The method of claim 13, wherein the second redundant version of the first content item stored in the distributed data storage system according to the second data redundancy scheme consumes less data storage space of the distributed data storage system than the first redundant version of the first content item stored in the distributed data storage system according to the first data redundancy scheme.

16. The method of claim 13, wherein:
the first redundant version of the first content item stored according to the first data redundancy scheme comprises a content item block of which the first content item is stored in at least two different geographic regions of the distributed data storage system; and
the second redundant version of the first content item stored the distributed data storage system according to the second data redundancy scheme comprises a first fragment of the content item block stored in a first geographic region of the distributed data storage system, a second fragment of the content item block stored in a second geographic region of the distributed data storage system, and a parity fragment stored in a third geographic region of the distributed data storage system.

17. The method of claim 6, wherein:
the first content item stored in the distributed data storage system according to the first data storage scheme is stored on one or more data storage devices of a first type of data storage device; and the first content item stored in the distributed data storage system according to the second data storage scheme is stored on one or more data storage devices of a second type of data storage device.

18. The method of claim 6, wherein:

the first probability is a probability that the first content item stored in the distributed data storage system according to the first data storage scheme will be accessed during the first period of time only during off-peak time periods; and the second data storage scheme is a colder storage relative to the first data storage scheme.

19. The method of claim 6, further comprising:

before using one or more trained machine learning models to compute the first probability, using one or more trained machine learning models to compute, based on a second set of one or more historical accesses to the first content item in the distributed data storage system when stored according to the first data storage scheme, a second probability that the first content item stored according to the first data storage scheme will be accessed during a second period of time that is prior to the first period of time; and based on the second probability, maintaining storage of the first content item according to the first data storage scheme.

20. A non-transitory computer-readable media comprising instructions which, when executed by a computing system, causes the computing system to perform:

storing a plurality of content items in a distributed data storage system according to a first data storage scheme;

using two or more trained machine learning models to compute, for each content item of the plurality of content items, based on a respective set of one or more historical accesses to the content item in the distributed data storage system when stored according to the first data storage scheme, a respective probability that the content item stored according to the first data storage scheme will be accessed subsequent to a reference time, the one or more historical accesses occurring prior to the reference time, the two or more trained machine learning models trained using training data corresponding to different time horizons with respect to one another; and based on the respective probability computed for each content item of the plurality of content items, maintaining storage of the respective content item according to the first data storage scheme or switching the respective content item to a second data storage scheme, wherein a first machine learning model of the two or more trained machine learning models trained using a shorter time horizon than one or more other time horizons of the different time horizons is again used in connection with determining whether to switch the content item from being stored in the first data storage scheme to a different data storage scheme.

* * * * *

UNITED STATES PATENT AND TRADEMARK OFFICE
CERTIFICATE OF CORRECTION

| | |
|---|---|
| PATENT NO. | : 11,422,721 B2 |
| APPLICATION NO. | : 16/839605 |
| DATED | : August 23, 2022 |
| INVENTOR(S) | : Michael Loh et al. |

It is certified that error appears in the above-identified patent and that said Letters Patent is hereby corrected as shown below:

In the Claims

Column 52, Claim 4, Line 25, delete "The computer system of claim" and insert --The computing system of claim--.

Column 53, Claim 10, Line 50, delete "second set one" and insert --second set of one--.

Signed and Sealed this
First Day of November, 2022

Katherine Kelly Vidal
*Director of the United States Patent and Trademark Office*